United States Patent
Chai

(10) Patent No.: US 11,501,836 B2
(45) Date of Patent: Nov. 15, 2022

(54) MEMORY DEVICE FOR CONTROLLING VOLTAGE OF BIT LINE AND METHOD OF OPERATING THE SAME

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 9 days.

(21) Appl. No.: 17/155,739

(22) Filed: Jan. 22, 2021

(65) Prior Publication Data

US 2022/0051728 A1    Feb. 17, 2022

(30) Foreign Application Priority Data

Aug. 12, 2020  (KR) .......................... 10-2020-0101435

(51) Int. Cl.
| | | |
|---|---|---|
| G11C 16/04 | (2006.01) | |
| G11C 16/24 | (2006.01) | |
| G11C 16/34 | (2006.01) | |
| G11C 16/10 | (2006.01) | |

(52) U.S. Cl.
CPC .......... *G11C 16/24* (2013.01); *G11C 16/0483* (2013.01); *G11C 16/10* (2013.01); *G11C 16/3459* (2013.01)

(58) Field of Classification Search
CPC ..... G11C 16/24; G11C 16/0483; G11C 16/10; G11C 16/3459; G11C 16/32

USPC ....................................................... 365/185.22
See application file for complete search history.

(56) References Cited

U.S. PATENT DOCUMENTS

| | | | | |
|---|---|---|---|---|
| 2010/0182844 A1* | 7/2010 | Han | ................... | G11C 16/3454 365/185.25 |
| 2012/0294093 A1* | 11/2012 | Yang | ..................... | G11C 16/26 365/185.22 |
| 2014/0056069 A1* | 2/2014 | Park | ....................... | G11C 16/24 365/185.25 |

FOREIGN PATENT DOCUMENTS

| | | |
|---|---|---|
| KR | 10-2014-0026115 | 3/2014 |
| KR | 10-2014-0073815 | 6/2014 |

* cited by examiner

*Primary Examiner* — Tha-O H Bui
(74) *Attorney, Agent, or Firm* — IP & T Group LLP

(57) ABSTRACT

The present technology relates to an electronic device. A memory device capable of reducing a time consumed in a program operation includes a memory cell array, a page buffer group connected to the memory cell array through a plurality of bit lines and a voltage generator configured to generate voltages to apply to each of a plurality of page buffers included in the page buffer group. Each of the plurality of page buffers includes a precharge circuit that controls potential levels of the plurality of bit lines to be maintained at precharge levels.

20 Claims, 16 Drawing Sheets

MEMORY DEVICE FOR CONTROLLING VOLTAGE OF BIT LINE AND METHOD OF OPERATING THE SAME

CROSS-REFERENCE TO RELATED APPLICATION

The present application claims priority under 35 U.S.C. § 119(a) to Korean patent application number 10-2020-0101435, filed on Aug. 12, 2020, which is incorporated herein by reference in its entirety.

BACKGROUND

1. Field of Invention

The present disclosure relates to an electronic device, and more particularly, to a memory device and a method of operating the same.

2. Description of Related Art

A storage device stores data under control of a host device such as a computer, a smart phone, or a smart pad. For storing data, the storage device includes a magnetic disk such as a hard disk drive (HDD), and/or a semiconductor memory such as a solid state drive (SSD) or a memory card, either of which may be a non-volatile memory.

In addition to a device in which data is stored, the storage device may also include a memory controller that controls storage of data in, and retrieval of data from, the memory device. In general, a memory device may be one of two types: a volatile memory or a non-volatile memory. Here, examples of non-volatile memories include a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), a ferroelectric RAM (FRAM) and the like.

SUMMARY

An embodiment of the present disclosure provides a memory device capable of reducing a verify time and a method of operating the same.

A memory device according to an embodiment of the present disclosure includes a memory cell array, a page buffer group connected to the memory cell array through a plurality of bit lines and a voltage generator configured to generate voltages to apply to each of a plurality of page buffers included in the page buffer group. Each of the plurality of page buffers includes a precharge circuit configured to control potential levels of the plurality of bit lines to be maintained at precharge levels.

A method of operating a memory device comprising a memory cell array, a plurality of page buffers connected to the memory cell array through a plurality of bit lines, and a voltage generator configured to generate voltages applied to each of the plurality of page buffers, the method comprising, increasing a potential of the plurality of bit lines during a program operation, performing a program on a selected memory cell among a plurality of memory cells included in the memory cell array and performing verification on the selected memory cell, wherein potential levels of the bit lines precharged in performing the program are maintained until performing the verification.

According to the present technology, a verify operation may be performed without precharge of the bit line during the verify operation by setting a voltage level of the bit line to a voltage level used for the verify operation during a program operation, and thus a time consumed in the verify operation may be reduced.

An integrated circuit coupled to a nonvolatile memory cell array through a first bit line, the integrated circuit comprising, a first path through which a power voltage is transferred to a node during a first program operation of programming a memory cell coupled to the first bit line, a second path through which the power voltage is transferred to the first bit line during a second program operation of programming a memory cell coupled to a second bit line to precharge the first bit line to the power voltage without performing discharge during the second program operation and a transistor configured to couple the node to the first bit line in response to a turn-on signal having a turn-on level during the first program operation to precharge the first bit line to the turn-on level less a threshold voltage level of the transistor without performing discharge during the first program operation, wherein each of the first and second program operations comprises a program phase and a verify phase.

DETAILED DESCRIPTION

Specific structural and functional description provided herein focuses on embodiments of the present disclosure. The present invention, however, may be implemented in various forms and carried out in various ways. Thus, the present invention is not limited to the disclosed embodiments.

Embodiments of the present disclosure are described in detail below with reference to the accompanying drawings, so that those skilled in the art to which the present disclosure pertains may practice and easily carry out the present invention. Throughout the specification, reference to "an embodiment," "another embodiment" or the like is not necessarily to only one embodiment, and different references to any such phrase are not necessarily to the same embodiment(s).

Figure 1:
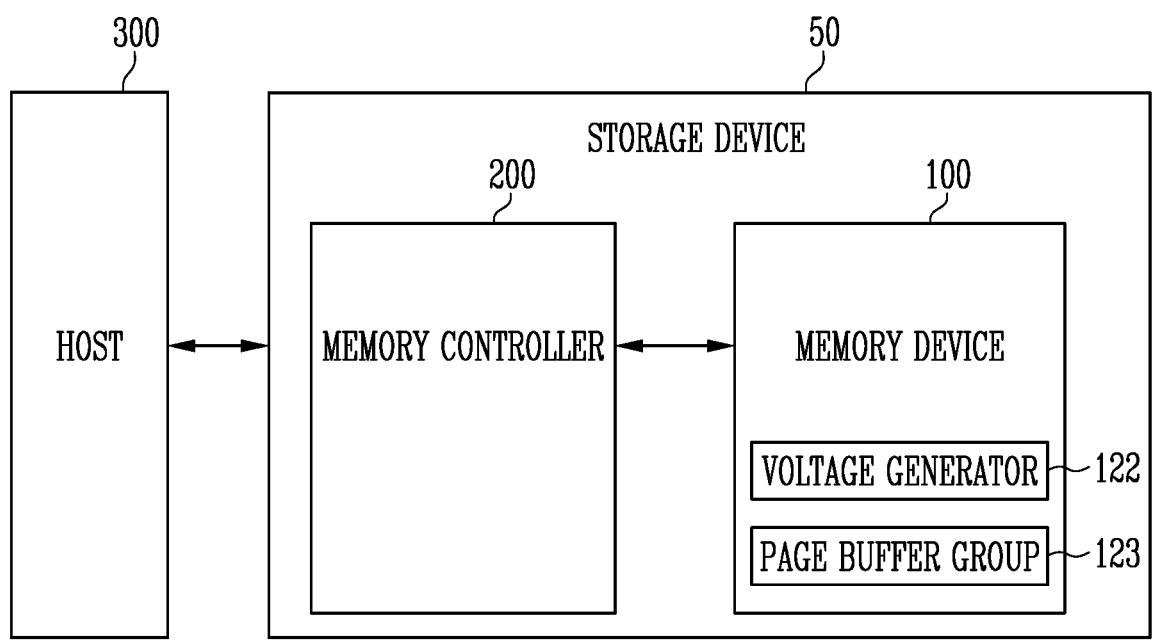
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may store data under control of a host 300 such as a cellular phone, a smartphone, an MP3 player, a laptop computer, a desktop computer, a game player, a TV, a tablet PC, or an in-vehicle infotainment system.

The storage device 50 may be manufactured or configured as any of various types of storage devices according to a host interface that defines a communication protocol with the host 300. For example, the storage device 50 may be configured as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and/or a memory stick.

The storage device 50 may be manufactured as any of various types of packages. For example, the storage device 50 may be manufactured as a package on package (POP), a system in package (SIP), a system on chip (SOC), a multi-chip package (MCP), a chip on board (COB), a wafer-level fabricated package (WFP), and/or a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, which may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, by way of example, the memory device 100 is a NAND flash memory.

The memory device 100 may be implemented as a two-dimensional array structure or a three-dimensional array structure. In the following description, the memory device 100 is described as having a three-dimensional array structure, but the present invention is not limited to such structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

In an embodiment, the memory device 100 may include a voltage generator 122. The voltage generator 122 may generate a voltage used when the memory device 100 performs an operation. An operation performed by the memory device 100 may be a program operation, a read operation, or an erase operation.

In an embodiment, the voltage generator 122 may generate voltages for precharging bit lines without discharging during both a program phase and a verify phase. The voltages for precharging the bit lines may be applied to gates of transistors included in each of a plurality of page buffers included in a page buffer group.

In an embodiment, the memory device 100 may include a page buffer group 123 configured of a plurality of page buffers. When the memory device 100 performs the program operation or the read operation, one or more of the plurality of page buffers in the page buffer group 123 may temporarily store data, and the temporarily stored data may be programmed to the plurality of memory cells included in the memory cell array in the memory device 100 or may be output to the memory controller 200.

For example, when the memory device 100 performs the program operation, data transmitted from the memory controller 200 may be temporarily stored in the plurality of page buffers and then programmed to the memory cells. The program operation may include the program phase and the verify phase.

In an embodiment, during the program operation, in the program phase to program data to the memory cells and in the verify phase to verify whether the program operation performed on the memory cells passed, the bit lines connecting each of the plurality of page buffers and the memory cell array may be precharged.

In one type of memory system that has been proposed, the bit lines may be precharged and then discharged to program data to the memory cells in the program phase, and the bit lines may be precharged again and then discharged again to verify the programmed data in the verify phase. That is, the bit lines may be precharged and then discharged in each of the program phase and the verify phase.

Since the bit lines are precharged and then discharged in each of the program phase and the verify phase, a time consumed in the verify operation may increase, which may mean that overall program operation time increases. Therefore, in the present disclosure, a method of precharging the bit lines without discharge during both the program phase and the verify phase is presented.

In an embodiment, each of the plurality of page buffers included in the page buffer group 123 may include a precharge circuit. The precharge circuit may precharge the bit lines without discharge during both the program phase and the verify phase. The bit lines may be divided into a selected bit line to which a memory cell on which the program operation is to be performed is connected, and an unselected bit line to which a memory cell on which the program operation is inhibited is connected. In an embodiment, a selected bit line may be precharged to a different level than an unselected bit line.

The memory controller 200 may control overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may convert the read request into a read command, select a PBA corresponding to the LBA, and then provide the read command and the PBA to the memory device 100. When an erase request is received from the host 300 together with the LBA, the memory controller 200 may convert the erase request into an erase command, select a PBA corresponding to the LBA, and then provide the erase command and the PBA to the memory device 100.

In an embodiment, the memory controller 200 may generate and transmit the program command, the address, and the data to the memory device 100 without a request from the host 300. For example, the memory controller 200 may provide the command, the address, and the data to the memory device 100 so as to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be external to the storage device 50. In this case, external volatile memory devices operably coupled to the storage device 50 may serve as the buffer memory.

In an embodiment, the memory controller 200 may control two or more memory devices. In this case, the memory controller 200 may control the memory devices according to an interleaving method in order to improve operation performance.

The host 300 may communicate with the storage device 50 using at least one of various communication protocols, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

Figure 2:
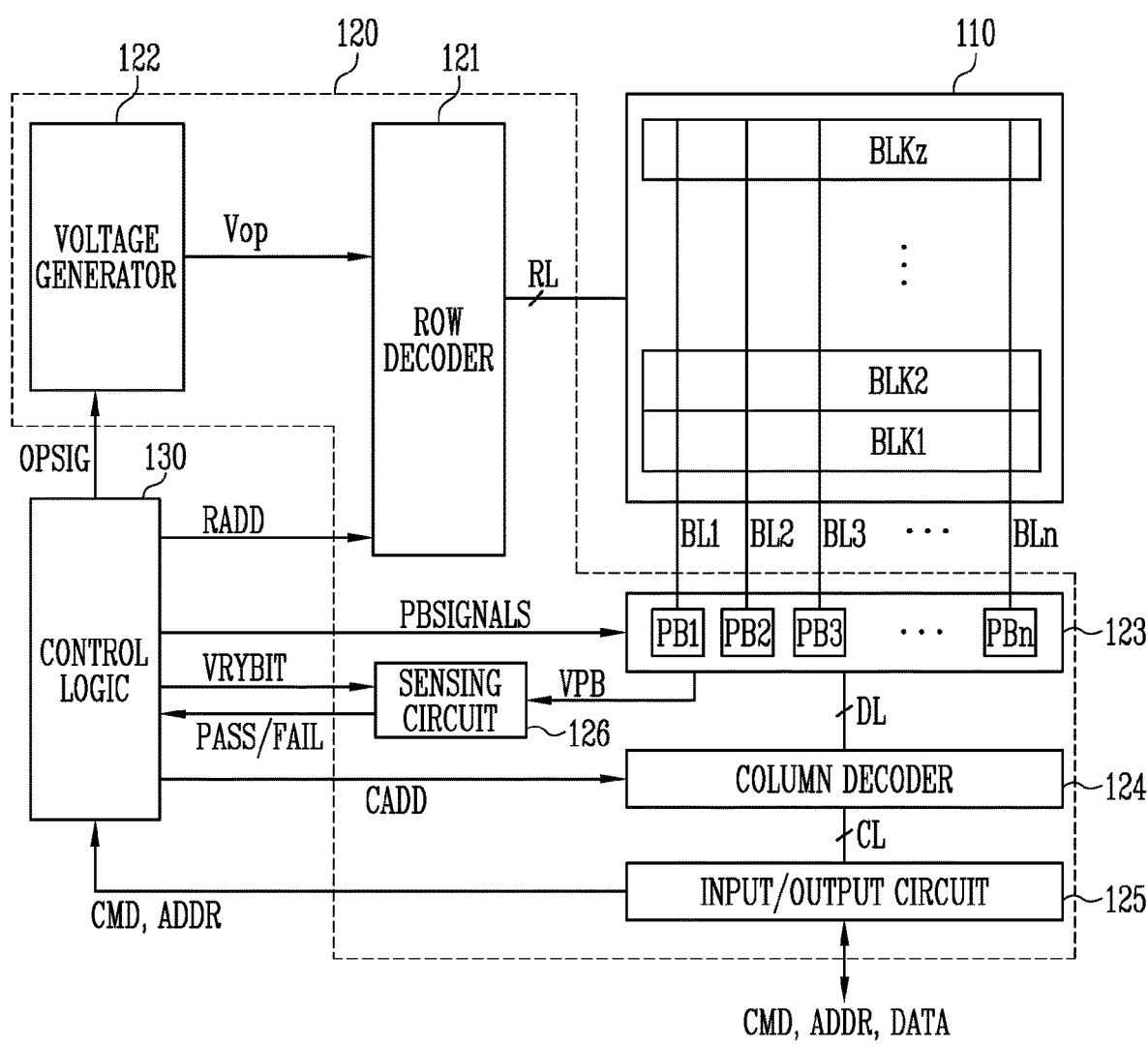
FIG. 2 is diagram illustrating a structure of a memory device, such as that of FIG. 1.

FIG. 2 is diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz, which are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. In an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn, which are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and output the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass or fail signal PASS or FAIL.

Figure 3:
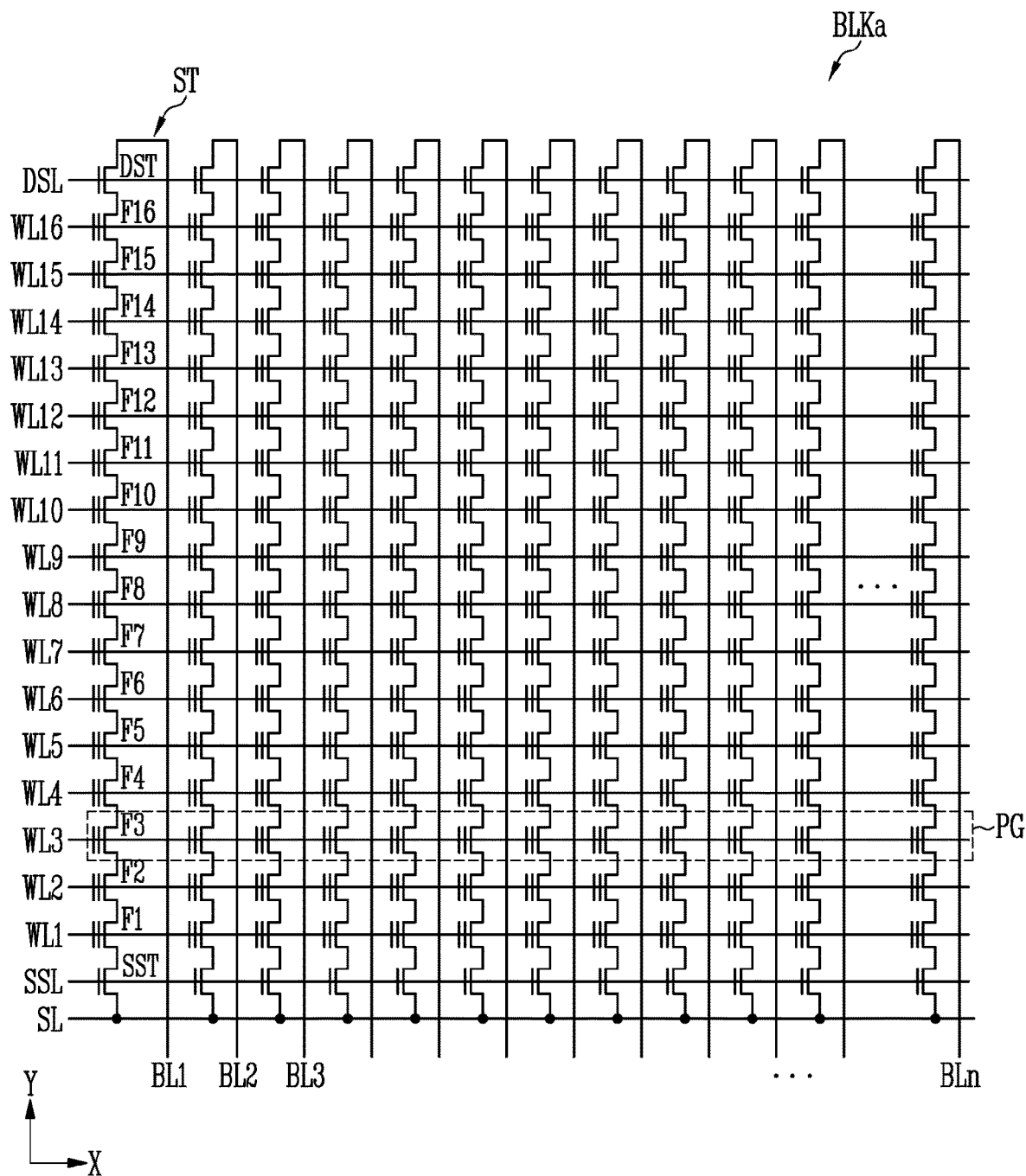
FIG. 3 is a diagram illustrating an embodiment of a memory cell array, such as that of FIG. 2.

FIG. 3 is a diagram illustrating an embodiment of the memory cell array of FIG. 2.

Referring to FIGS. 2 and 3, FIG. 3 is a circuit diagram showing a representative memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Since the strings may be configured to be identical to each other, a string ST connected to the first bit line BL1 will be specifically described, as an example.

The string ST may include a source select transistor SST, a plurality of memory cells, e.g., sixteen denoted F1 to F16, and a drain select transistor DST connected in series between the source line SL and the first bit line BL1. One string ST may include at least one source select transistor SST and at least one drain select transistor DST, and may include more than the sixteen memory cells, i.e., F1 to F16, shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the same number of physical pages PPG as there are word lines WL1 to WL16.

One memory cell may store one bit of data. This is commonly referred to as a single level cell (SLC). In this case, one physical page PPG may store one logical page (LPG) data. The number of data bits included in one logical page (LPG) may be the same as the number of memory cells in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is generally referred to as a multi-level cell (MLC). However, recently, as memory cell capacity has increased, the term multi-level cell (MLC) more specifically refers to a memory cell in which two bits of data is stored. In that case, a memory cell in which three or more bits of data are stored is referred to as a triple level cell (TLC), and a memory cell in which four or more bits of data are stored is referred to as a quadruple level cell (QLC). In general, the present invention may be applied to the memory device 100 having memory cells in which two or more bits of data are stored in each.

In another embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
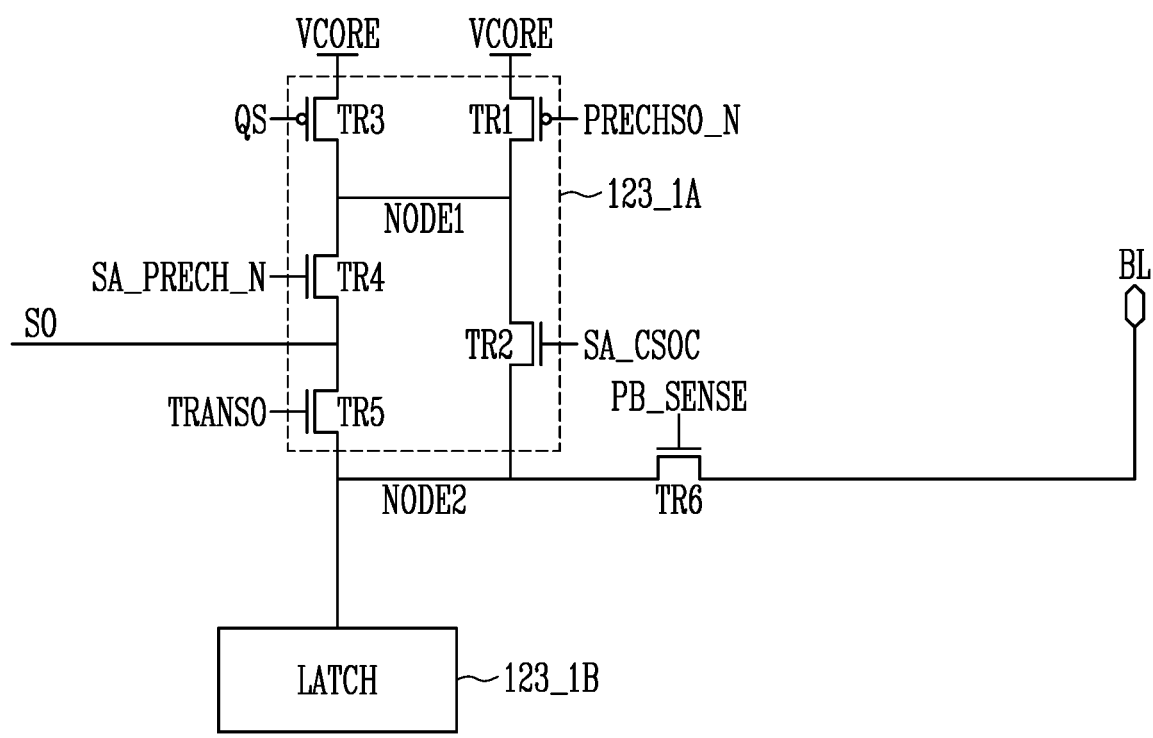
FIG. 4 is a diagram illustrating a portion of a page buffer in a page buffer group.

FIG. 4 is a diagram illustrating a portion of one of the plurality of page buffers included in the page buffer group of FIG. 2.

Referring to FIGS. 2 and 4, FIG. 4 illustrates a portion of the first page buffer PB1 among the first to n-th page buffers PB1 to PBn in the page buffer group 123 of FIG. 2. Each of the second to n-th page buffers PB2 to PBn may be configured identically to the first page buffer PB1, as shown in FIG. 4.

In an embodiment, the first page buffer PB1 may include a data transmitter 123_1A, a latch 123_1B, and a sixth transistor connecting the data transmitter 123_1A, the latch 123_1B, and a bit line BL.

The data transmitter 123_1A may include first to fifth transistors TR1 to TR5. The data transmitter 123_1A may transmit data sensed through a sensing node SO to the memory controller 200 or transmit data, received from the memory controller 200, to the memory cell array 110 through the bit line BL.

In an embodiment, among the first to fifth transistors TR1 to TR5 in the data transmitter 123_1A, the first and third transistors TR1 and TR3 may be implemented as PMOS transistors, and the second, fourth, and fifth transistors TR2, TR4, and TR5 may be implemented as NMOS transistors.

In an embodiment, the first transistor TR1 may connect a power voltage VCORE to the second transistor TR2. A first node NODE1 connects the first transistor TR1 and the second transistor TR2. The second transistor TR2 may be connected to the sixth transistor TR6 through a second node NODE2. The third transistor TR3 may be disposed between the power voltage VCORE and the first node NODE1 in parallel with the first transistor TR1. The fourth transistor TR4 may be connected between the first node NODE1 and the sensing node SO. The fifth transistor TR5 may be connected between the sensing node SO and the latch 123_1B.

Further, a first signal PRECHSO_N, which is an inverted sensing node precharge signal, may be applied to a gate of the first transistor TR1, a second signal SA_CSOC, which is a current sensing signal, may be applied to a gate of the second transistor TR2, a third signal QS which is a data signal may be applied to a gate of the third transistor TR3, a fourth signal SA_PRECH_N which is an inverted current precharge signal, may be applied to a gate of the fourth transistor TR4, and a sensing node transmission signal may be applied to a gate of the fifth transistor TR5.

In an embodiment, data may be stored in the latch 123_1B. For example, the data sensed through the sensing node SO may be stored or the data transmitted from the memory controller 200 may be stored.

In an embodiment, the sixth transistor TR6 may be implemented as an NMOS transistor. In addition, a sixth signal PB_SENSE, which is a page buffer sensing signal, may be applied to a gate of the sixth transistor TR6.

During the program operation, voltages applied to the first to sixth transistors TR1 to TR6 are described in more detail with reference to FIG. 5.

Figure 5:
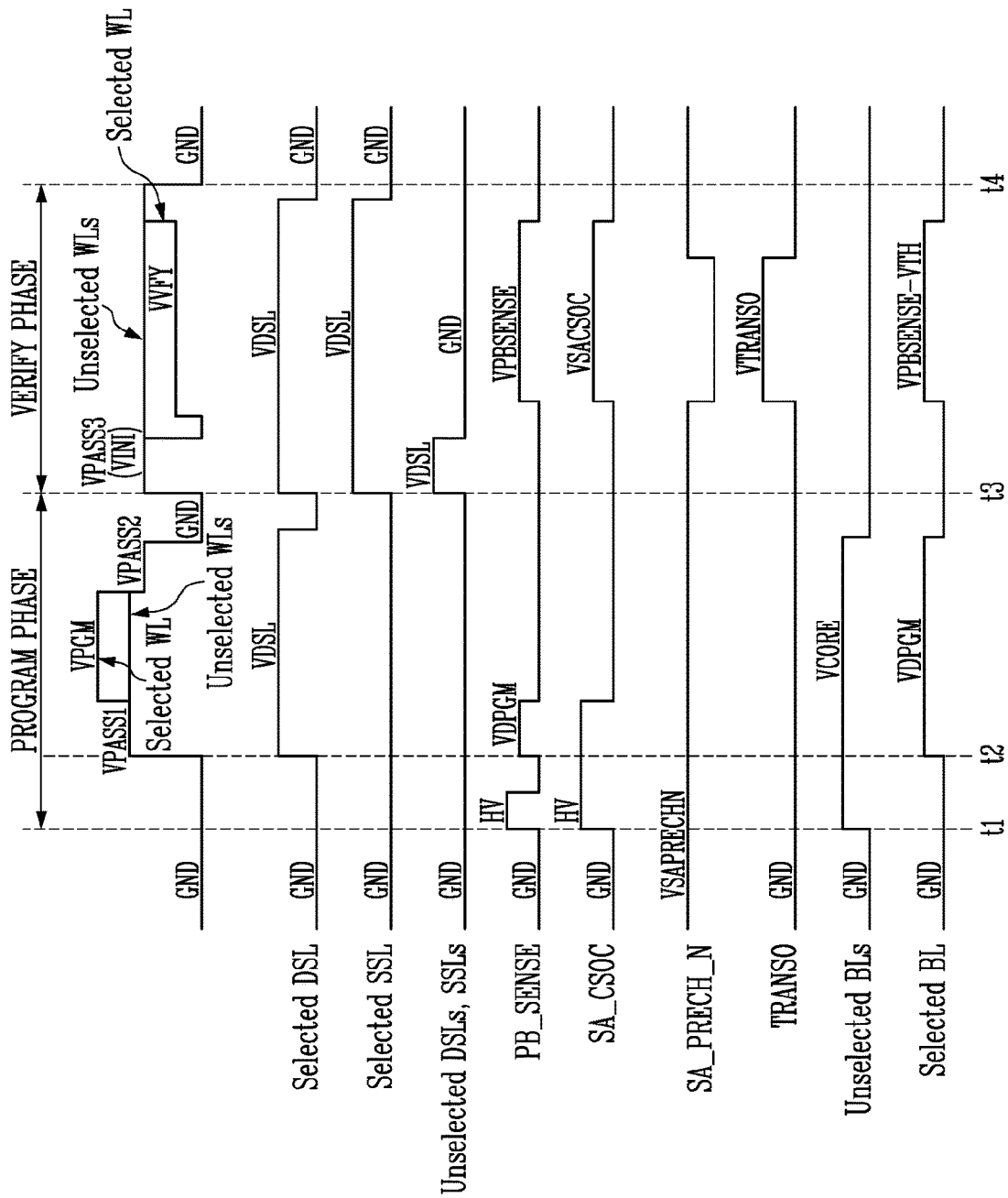
FIG. 5 is a diagram illustrating a signal applied to each of lines and the page buffer during a program operation.

FIG. 5 is a diagram illustrating a signal applied to each of lines and the page buffer during the program operation.

FIG. 5 illustrates a representative one of a plurality of program loops performed when the memory device 100 performs the program operation. Each of the plurality of program loops may include a program phase PROGRAM PHASE and a verify phase VERIFY PHASE. Therefore, FIG. 5 illustrates the program phase PROGRAM PHASE and the verify phase VERIFY PHASE in each of the plurality of program loops.

In FIG. 5, the voltage applied to each of the lines, as well as voltages or signals applied to gates of transistors in the page buffer may be generated by the voltage generator 122 of FIG. 2.

The program phase PROGRAM PHASE may include a bit line setup phase (t1 to t2) and a program pulse application phase (t2 to t3).

In an embodiment, in the bit line setup phase (t1 to t2), the voltage applied to the gates of the second transistor TR2 and the sixth transistor TR6 of FIG. 4 may be an HV voltage. That is, in the bit line setup phase (t1 to t2), each of the second signal SA_CSOC applied to the second transistor TR2 and the sixth signal PB_SENSE applied to the sixth transistor TR6 may have an HV voltage level.

Since the HV voltage is applied to the gates of the second transistor TR2 and the sixth transistor TR6, unselected bit lines Unselected BLs to which memory cells on which a program is inhibited are connected may be precharged to a VCORE level.

In addition, the voltage applied to the gate of the fourth transistor TR4 may be a VSAPRECHN voltage, and the voltage applied to the fifth transistor TR5 may be 0V (GND). That is, the fourth signal SA_PRECH_N applied to the fourth transistor TR4 may have the VSAPRECHN voltage level, and the fifth signal TRANSO applied to the fifth transistor TR5 may be 0V level.

In the bit line setup phase (t1 to t2), the sixth signal PB_SENSE is changed from the HV level to a low level, but the second signal SA_CSOC may be maintained at the HV level, and the fourth signal SA_PRECH_N may be maintained at the VSAPRECHN level.

Thereafter, in the program pulse application phase (t2 to t3), while a first pass voltage VPASS1 is applied to all word lines, the sixth signal PB_SENSE may be maintained at a VDPGM level and the second signal SA_CSOC may be maintained at the HV level, and then when a program voltage VPGM is applied to a selected word line Selected WL, the sixth signal PB_SENSE and the second signal SA_CSOC may become 0V (GND) level.

In an embodiment, in the program pulse application phase (t2 to t3), after the first pass voltage VPASS1 is applied to all word lines ALL WLs, the program voltage VPGM may be applied to the selected word line Selected WL and the first pass voltage VPASS1 may be maintained in the unselected word lines Unselected WLs.

In an embodiment, the unselected bit lines Unselected BLs to which the memory cells on which the program is inhibited are connected may be precharged to the VCORE level in the bit line setup phase (t1 to t2), and the selected bit line Selected BL to which the programmed memory cell is connected may be precharged to the VDPGM level as the sixth signal PB_SENSE reaches the VDPGM level at t2. The unselected bit lines Unselected BLs and the selected bit line Selected BL may be precharged based on data input to the page buffers.

A selected memory cell among the memory cells connected to the selected word line Selected WL may be programmed by applying the program voltage VPGM to the selected word line Selected WL in a state in which the bit lines are precharged.

After the selected memory cell among the memory cells connected to the selected word line Selected WL is programmed, the unselected bit lines Unselected BLs and the selected bit line Selected BL may be discharged, and may be precharged again in the verify phase VERIFY PHASE.

In an embodiment, in order to program the selected memory cell, at t2 (or at a time point slightly earlier than t2), a drain select line voltage VDSL may be applied to a selected drain select line Selected DSL. That is, a positive voltage higher than 0V may be applied to the selected drain select line Selected DSL to turn on the drain select transistor connected to the selected drain select line Selected DSL.

In addition, in the program pulse application phase (t2 to t3), since the ground voltage GND may be applied to the source line SL of FIG. 3, the ground voltage GND, that is, 0V, may be applied to a selected source select line Selected SSL. When the ground voltage GND is applied to the selected source select line Selected SSL, the source select transistor connected to the selected source select line Selected SSL may be turned off.

In an embodiment, in the program pulse application phase (t2 to t3), 0V, which is the ground voltage GND, may be applied to unselected drain select lines and unselected source select lines Unselected DSLs and SSLs. That is, 0V may be applied to the unselected drain select lines and unselected source select lines Unselected DSLs and SSLs so that the unselected memory cells are not programmed.

After the program voltage VPGM is applied to the selected word line Selected WL during a set time period, a second pass voltage VPASS2 may be applied to all word lines Selected WL and Unselected WLs. That is, after applying the program voltage VPGM to the selected word line Selected WL and before the verify phase VERIFY PHASE proceeds, the same voltage level may be applied to all word lines. Thereafter, all word lines (Selected WL and Unselected WLs) may be discharged.

After all word lines are discharged, an operation for channel initialization may be performed in the verify phase VERIFY PHASE.

For example, after all word lines are discharged, a channel initialization voltage VINI may be applied to all word lines. Thereafter, the selected word line Selected WL may be discharged, and the voltage applied to the unselected word lines Unselected WLs may be maintained at the channel initialization voltage VINI. The channel initialization voltage VINI may be a third pass voltage VPASS3.

Since the discharge operation is performed in a state in which the voltages of all word lines are the same, coupling between different word lines does not occur. Therefore, a phenomenon in which a voltage of some word lines is relatively lower or higher than that of other word lines may be prevented.

In an embodiment, when the program phase PROGRAM PHASE ends, at t3, the verify phase VERIFY PHASE may proceed.

In the verify phase VERIFY PHASE, a channel initialization operation may be performed. When the channel initialization operation is performed, the channel initialization voltage VINI may be applied to all word lines, and the drain source line voltage VDSL may be applied to all drain select lines and all source select lines (Selected DSL and SSL and Unselected DSLs and SSLs). That is, before the verify voltage is applied to the selected word line, a channel of the memory cells may be initialized.

Thereafter, the voltage of the selected word line Selected WL may become 0V. That is, before performing the verify operation, the voltage level of the selected word line WL may be set to a level of the channel initialization voltage VINI, and then discharged, to set to 0V. Since the verify operation is quickly performed when the voltage of the unselected word lines Unselected WLs is maintained as the third pass voltage VPASS3, the voltage applied to the unselected word lines Unselected WLs may be maintained as the third pass voltage VPASS3.

After the channel of the memory cells is initialized, the unselected drain select lines and unselected source select lines Unselected DSLs and SSLs are discharged, and thus the voltage of those lines may become 0V.

That is, in order to prevent the unselected drain select lines and unselected source select lines Unselected DSLs and SSLs from becoming a specific voltage level, after the drain source line voltage VDSL is applied to those lines at t3, the unselected drain select lines and unselected source select lines Unselected DSLs and SSLs may be discharged.

Thereafter, a verify voltage VVFY may be applied to the selected word line Selected WL. Through the verify operation, it may be determined whether the memory cells have reached a target program state. The voltage applied to the unselected word lines WLs may be maintained as the third pass voltage VPASS3.

When the verify voltage VVFY is applied to the selected word line Selected WL, the signals applied to the page buffer may be set.

Referring to FIG. 4, when the verify voltage VVFY is applied to the selected word line Selected WL, the voltage applied to the gate of the sixth transistor may be set to a VPBSENSE level, the voltage applied to the gate of the second transistor may be set to a VSACSOC, the voltage applied to the gate of the fifth transistor may be set to a VTRANSO level, and the voltage applied to the gate of the fourth transistor may be set to 0V (GND).

That is, the sixth signal PB_SENSE may be the VPBSENSE level, the second signal SA_CSOC may be the VSACSOC level, the fifth signal TRANSO may be the VTRANSO level signal, and the fourth signal SA_PRECH_N may be a signal of 0V.

After data is sensed, the fourth signal SA_PRECH_N may be set to a VSAPRECHN level, and the fifth signal TRANSO may be set to 0V.

When the verify voltage VVFY is applied to the selected word line Selected WL, the voltage of the bit line to which the selected memory cell is connected may be precharged by setting the levels of the sixth signal PB_SENSE, the second signal SA_CSOC, the fifth signal TRANSO, and the fourth signal SA_PRECH_N. Since the verify operation is not performed on the unselected memory cells, the bit lines to which the unselected memory cells are connected may not be precharged.

After the verify operation is performed, the third pass voltage may be applied to all word lines Selected WL and Unselected WLs, and all such word lines may be simultaneously discharged. That is, an equalizing operation may be performed.

Since the verify operation has ended, the sixth signal PB_SENSE and the second signal SA_CSOC may be set to 0V (GND).

After the equalizing operation is performed, all word lines Selected WL and Unselected WLs, all drain select lines and all source select lines Selected DSL and SSL and Unselected DSLs and SSLs may be discharged and may reach 0V.

In an embodiment, when the selected memory cell passes the verify operation, the program operation may end. However, when the selected memory cell does not pass the verify operation, a next program loop may be performed.

Figure 6:
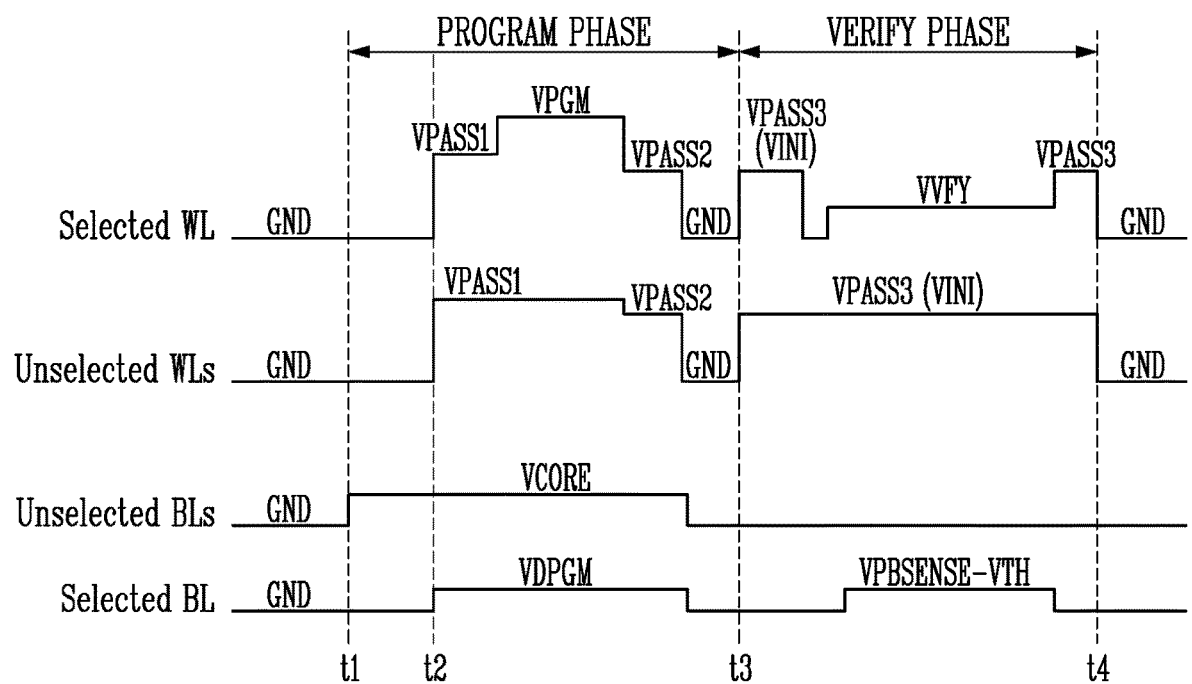
FIG. 6 is a diagram illustrating a bit line precharge operation performed in each phase during the program operation.

FIG. 6 is a diagram illustrating a bit line precharge operation performed in each phase during the program operation.

Referring to FIGS. 5 and 6, among the voltages shown in FIG. 5, FIG. 6 illustrates the voltage applied to the selected word line Selected WL and the voltage applied to the unselected word lines Unselected WLs, and a voltage level set in the unselected bit lines Unselected BLs to which the memory cells on which the program is inhibited are connected and the selected bit line Selected BL to which the selected memory cell on which the program is allowed is connected.

In an embodiment, before the first pass voltage VPASS1 is applied to the selected word line Selected WL and the unselected word lines Unselected WLs, the unselected bit lines Unselected BLs to which the memory cells on which the program is inhibited are connected may be first precharged to the VCORE level. That is, since the unselected memory cells are not programmed, the bit lines to which the unselected memory cells are connected may be precharged to the VCORE level.

Thereafter, when the first pass voltage VPASS1 starts to be applied to the selected word line Selected WL and the unselected word lines Unselected WLs, the selected bit line Selected BL which is the bit line to which the selected memory cell is connected may be precharged to the VDPGM level so that the program operation is performed on the selected memory cell.

After the program voltage is applied to the selected word line Selected WL, the second pass voltage VPASS2 may be applied to the selected word line Selected WL and the unselected word lines Unselected WLs, and when potentials of the selected word line Selected WL and the unselected word lines Unselected WLs are equal to the second pass voltage VPASS2, the selected word line Selected WL and the unselected word lines Unselected WLs may be simultaneously discharged. When the selected word line Selected WL and the unselected word lines Unselected WLs are discharged, the selected bit line Selected BL and the unselected bit lines Unselected BLs may also be discharged together.

In the verify phase VERIFY PHASE performed after the program phase PROGRAM PHASE, the channel initialization voltage VINI may be applied to all word lines Selected WL and Unselected WLs. Thereafter, the selected word line Selected WL may be discharged, and the voltage applied to the unselected word lines Unselected WLs may be maintained at the channel initialization voltage VINI. The channel initialization voltage may be the third pass voltage VPASS3.

The verify voltage may be applied to the selected word line Selected WL to verify whether the selected memory cell is programmed, and the selected bit line Selected BL to which the selected memory cell is connected may be precharged by a difference VPBSENSE-VTH between the voltage level VPBSENSE applied to the sixth transistor TR6 of FIG. 4 and the threshold voltage level VTH of the sixth transistor TR6. When the bit line to which the selected memory cell is connected is precharged, whether programming passed or failed may be determined through a change in a magnitude of a current flowing through the sensing node SO during the verify operation.

However, in the program phase PROGRAM PHASE and the verify phase VERIFY PHASE, since each of the selected bit line Selected BL and the unselected bit line Selected BL is precharged and then discharged, that is, since the bit lines are precharged in each phase, a time consumed in the program operation may be lengthened.

Therefore, in the present disclosure, a method of precharging the bit lines without discharging during both the program phase PROGRAM PHASE and the verify phase VERIFY PHASE is presented.

Figure 7:
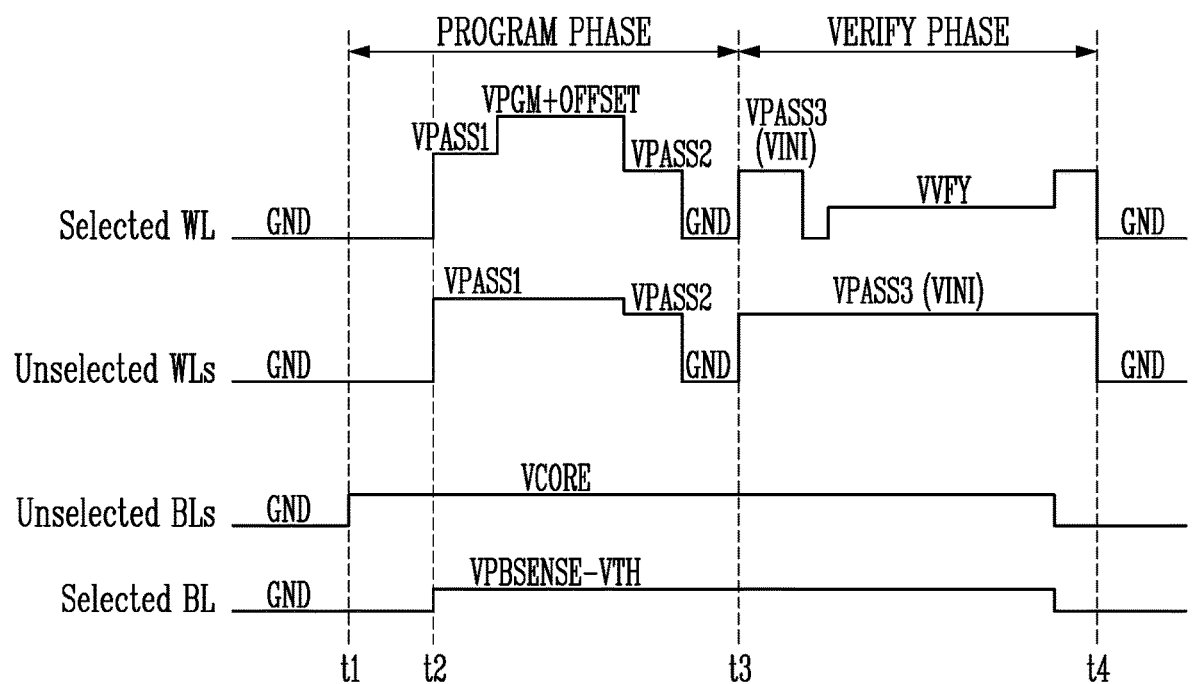
FIG. 7 is a diagram illustrating a bit line precharge operation.

FIG. 7 is a diagram illustrating the bit line precharge operation performed in the present disclosure.

Referring to FIG. 7, FIG. 7 illustrates voltages applied to the selected word line Selected WL and the unselected word lines Unselected WLs, and voltage levels set to the unselected bit lines Unselected BLs to which the memory cells on which the program is inhibited are connected, and the selected bit lines Selected BL to which the selected memory cells on which the program is allowed are connected when precharging the bit lines without discharging during both the program phase PROGRAM PHASE and the verify phase VERIFY PHASE in the program operation.

In an embodiment, in the program phase PROGRAM PHASE, a period t1 to t2 may be the bit line setup phase, a period t2 to t3 may be the program pulse application phase, and the verify phase VERIFY PHASE may be performed in a period t3 to t4.

In an embodiment, before the first pass voltage VPASS1 is applied to the selected word line Selected WL and the unselected word lines Unselected WLs, the unselected bit lines Unselected BLs to which the memory cells on which the program is inhibited are connected may be first precharged to the VCORE level. That is, since the unselected memory cells are not programmed, the bit lines to which the unselected memory cells are connected may be precharged to the VCORE level.

Thereafter, when the first pass voltage VPASS1 starts to be applied to the selected word line Selected WL and the unselected word lines Unselected WLs, the selected bit line Selected BL which is the bit line to which the selected memory cell is connected may be precharged so that the program operation is performed on the selected memory cell.

However, unlike the process shown in FIGS. 5 and 6, the selected bit line Selected BL may be precharged to the VPBSENSE-VTH level, which is the difference between the voltage level VPBSENSE applied to the sixth transistor TR6 and the threshold voltage level VTH of the sixth transistor TR6, which is different than the VDPGM level (see FIGS. 5 and 6). That is, the selected bit line Selected BL may be precharged to a precharge level in the verify phase of FIGS. 5 and 6.

In an embodiment, when the selected bit line Selected BL and the unselected bit lines Unselected BLs are precharged in the program phase PROGRAM PHASE, the precharged potential level may be maintained at the selected bit line Selected BL and the unselected bit lines Unselected BLs even in the verify phase VERIFY PHASE, after the program phase PROGRAM PHASE. Therefore, since the bit lines are not discharged and precharged again in the verify phase VERIFY PHASE, a time consumed in the program operation may be shortened.

Since the selected bit line Selected BL is precharged to the VPBSENSE-VTH level, in order to program the selected memory cell, a voltage VPGM+OFFSET, where the OFFSET is a positive voltage, may be applied to the selected word line Selected WL. Herein, a voltage VPGM is a default voltage or a start voltage, corresponding to target state of the selected memory cell, for programming the selected memory cell, before gradually increasing as a step voltage. Moreover, the OFFSET may be greater than or equal to the VPBSENSE-VTH, VPBSENSE-VTH the selected bit line Selected BL precharge level, in the verify phase VERIFY PHASE.

That is, since the selected bit line Selected BL is precharged with the voltage level VPBSENSE-VTH, which is higher than the voltage used in precharging the bit lines in each of the program phase PROGRAM PHASE and the verify phase VERIFY PHASE, the voltage applied to the selected word line Selected WL is greater than or equal to the offset voltage OFFSET. Furthermore, the VDPGM level may be the same as the VPBSENSE-VTH level.

When the voltage VPGM+OFFSET greater than the program voltage VPGM by the offset voltage OFFSET is applied to the selected word line Selected WL, the selected memory cell may be programmed to the target program state.

Thereafter, in the verify phase VERIFY PHASE, the potential levels of the selected bit lines Selected BL and the unselected bit lines Unselected BLs may be maintained at the same levels as in the program phase PROGRAM PHASE, respectively.

For example, in the verify phase VERIFY PHASE, the potential level of the selected bit line Selected BL is maintained at the VPBSENSE-VTH level, and thus the selected memory cell may be sensed through the selected bit line Selected BL. As the potential level of the unselected bit lines Unselected BLs are maintained at the VCORE level, the unselected memory cells may also be sensed, but only whether the program operation of the selected memory cell passed is determined; thus, a result of sensing the unselected memory cells may be ignored.

When the operation of applying the verify voltage VVFY to the selected word line is completed, the selected bit line Selected BL and the unselected bit lines Unselected BLs may be discharged.

As a result, during the program operation, the selected bit lines Selected BL and the unselected bit lines Unselected BLs are precharged in the program phase PROGRAM PHASE, the precharge level is maintained even in the verify phase VERIFY PHASE, and thus precharge may be performed once on the bit lines without discharge. Therefore, since the program operation is performed through one precharge on the selected bit line Selected BL and the unselected bit lines Unselected BLs, a program operation time may be reduced.

Figure 8:
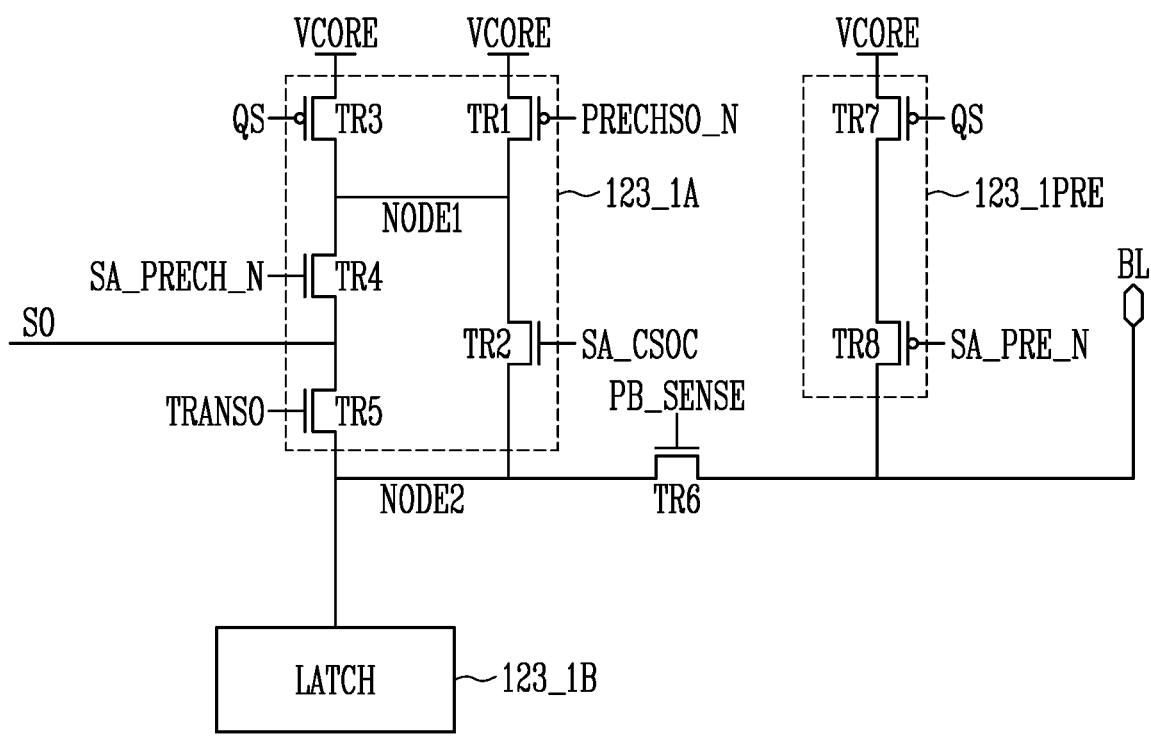
FIG. 8 is a diagram illustrating a precharge circuit of a page buffer for a bit line precharge operation, such as that described with reference to FIG. 7.

FIG. 8 is a diagram illustrating the precharge circuit added to the page buffer for the bit line precharge operation described with reference to FIG. 7.

Referring to FIGS. 4 and 8, FIG. 8 illustrates a first page buffer including a precharge circuit 123_1PRE in addition to the first page buffer PB1 of FIG. 4. In an embodiment, the precharge circuit 123_1PRE may include seventh and eighth transistors TR7 and TR8. The seventh and eighth transistors TR7 and TR8 may be implemented as PMOS transistors. The third signal QS which is the data signal may be applied to a gate of the seventh transistor TR7, and the eighth signal SA_PRE_N which is the inverted precharge signal may be applied to a gate of the eighth transistor TR8. The third signal QS may be the same as the signal applied to the gate of the third transistor TR3 of FIG. 4.

Elements in FIG. 8 that are also present in FIG. 4 and have been described in connection with that figure are not described again here.

In an embodiment, the third signal QS may vary according to whether the memory cell is programmed. When the memory cell connected to the bit line is the selected memory cell on which the program operation is to be performed, the third signal QS may be at a VQS level during both the program phase PROGRAM PHASE and the verify phase VERIFY PHASE. Conversely, when the memory cell connected to the bit line is the unselected memory cell on which the program is inhibited, the third signal QS may be at a 0V (GND) level during both the program phase PROGRAM PHASE and the verify phase VERIFY PHASE.

Therefore, when the memory cell connected to the bit line is the selected memory cell, since the third signal QS has the VQS level during both the program phase PROGRAM PHASE and the verify phase VERIFY PHASE, the seventh transistor TR7 is turned off to block application of the VCORE voltage to the bit line. Therefore, the bit line may be precharged to the VPBSENSE-VTH level when the sixth signal PB_SENSE applied to the gate of the sixth transistor TR6 is at VPBSENSE level. According to an embodiment, the sixth signal PB_SENSE may be 0V (GND) during the bit line setup phase (t1 to t2) and may be VPBSENSE during the program pulse application phase (t2 to t3) and the verify phase VERIFY PHASE.

However, when the memory cell connected to the bit line is the unselected memory cell, since the third signal QS is 0V (GND) during both the program phase PROGRAM PHASE and the verify phase VERIFY PHASE, the seventh transistor TR7 is turned on during both the program phase PROGRAM PHASE and the verify phase VERIFY PHASE. Therefore, the bit line may be precharged to the VCORE level while the eighth transistor TR8 is turned on (i.e., the eighth signal SA_PRE_N is 0V (GND)) during both the program phase PROGRAM PHASE and the verify phase VERIFY PHASE.

Figure 9:
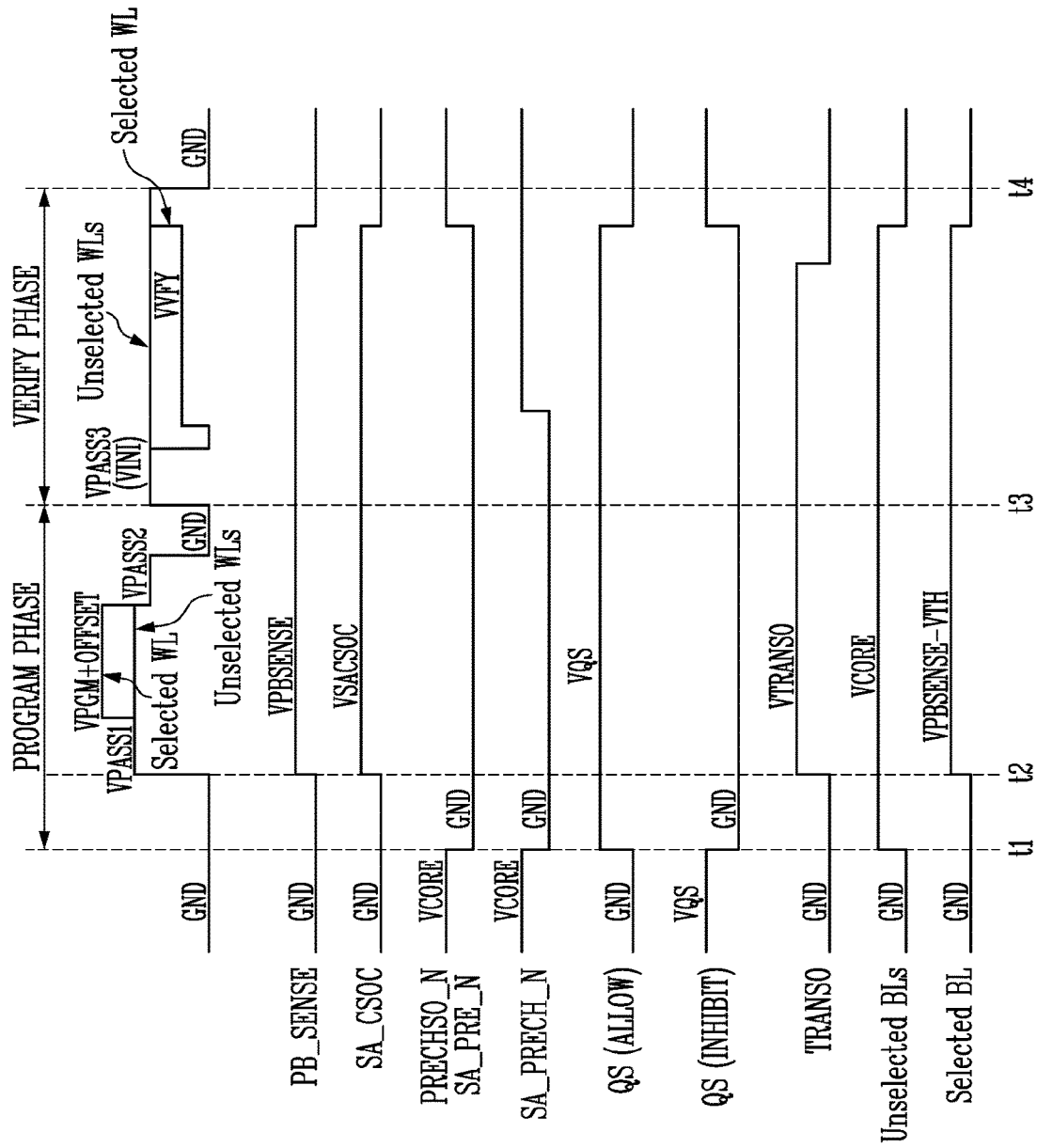
FIG. 9 is a diagram illustrating signals applied to a page buffer according to an embodiment of the present disclosure.

FIG. 9 is a diagram illustrating a signal applied to the page buffer according to an embodiment of the present disclosure.

Referring to FIGS. 8 and 9, FIG. 9 is a diagram illustrating a signal applied to gates of transistors included in the first page buffer PB1 of FIG. 8 and a potential level set to the bit line BL.

Further, the voltages or signals applied to the gates of the transistors included in the page buffer may be generated by the voltage generator 122 of FIG. 2.

In an embodiment, in the bit line setup phase (t1 to t2), the first signal PRECHSO_N, the eighth signal SA_PRE_N, and the fourth signal SA_PRECH_N may be changed from the VCORE level to the 0V (GND) level.

In addition, when the memory cell connected to the first page buffer PB1 through the bit line BL is the selected memory cell (ALLOW), the third signal QS may be changed from the 0V (GND) level to the VQS level. However, when the memory cell connected to the first page buffer PB1 through the bit line BL is the unselected memory cell (INHIBIT), the third signal QS may be changed from the VQS level to the 0V (GND) level.

The sixth signal PB_SENSE, the second signal SA_CSOC, and the fifth signal TRANSO may be maintained at the 0V (GND) level in the bit line setup phase t1 to t2.

Therefore, in the bit line setup phase (t1 to t2), when the memory cell connected to the first page buffer PB1 through the bit line BL is the unselected memory cell, that is, the unselected bit lines Unselected BLs, which are the bit lines to which the memory cells on which the program is inhibited are connected, may be precharged to the VCORE level. However, when the memory cell connected to the first page buffer PB1 through the bit line BL is the selected memory cell, that is, the selected bit line Selected BL, which is the bit line to which the memory cell on which the program is allowed is connected, may not be precharged and may be at 0V (GND) level.

For example, when the memory cell connected to the first page buffer PB1 through the bit line BL is the unselected memory cell, as the second and sixth transistors TR2 and TR6 are turned off and the seventh and eighth transistors TR7 and TR8 are turned on, the bit line BL may be precharged to the VCORE level. When the memory cell connected to the first page buffer PB1 through the bit line BL is the selected memory cell, as the second, sixth, and seventh transistors TR2, TR6, and TR7 are turned off in the bit line setup phase (t1 to t2), the potential of the bit line BL may be at the 0V (GND) level in the bit line setup phase (t1 to t2).

After the bit line setup phase (t1 to t2), when the program pulse application phase (t2 to t3) starts, that is, when the first pass voltage VPASS1 starts to be applied to all word lines Selected WL and Unselected WLs, the sixth signal PB_SENSE may be changed from the 0V (GND) level to the VPBSENSE level, the second signal SA_CSOC may be changed from the 0V (GND) level to the VSACSOC level, and the fifth signal TRANSO may be changed from the 0V (GND) level to the VTRANSO level.

Therefore, when the program pulse application phase (t2 to t3) starts, the memory cell connected to the first page buffer PB1 through the bit line BL is the unselected memory cell, that is, the unselected bit lines Unselected BLs, which are the bit lines to which the memory cells on which the program is inhibited (INHIBIT) are connected, may be maintained at the VCORE level. However, when the memory cell connected to the first page buffer PB1 through the bit line BL is the selected memory cell, that is, the selected bit line Selected BL, which is the bit line to which the memory cell on which the program is allowed (ALLOW) is connected may be precharged to VPBSENSE-VTH level.

For example, since the seventh and eighth transistors TR7 and TR8 are still turned on in the program pulse application phase (t2 to t3), the potential of the bit line BL may be maintained at the VCORE level in the program pulse application phase (t2 to t3).

For example, when the memory cell connected to the first page buffer PB1 through the bit line BL is the selected memory cell, as the first, second, and sixth transistors TR1, TR2, and TR6 are turned on and the seventh transistor TR7 is turned off in the program pulse application phase (t2 to t3), the bit line BL may be precharged by the difference VPBSENSE-VTH between the voltage level VPBSENSE applied to the sixth transistor TR6 and the threshold voltage level VTH of the sixth transistor TR6 in the program pulse application phase (t2 to t3).

Thereafter, as the verify voltage is applied to the selected word line and the third pass voltage VPASS3 is applied to the unselected word lines, the verify operation may be performed.

When the operation of applying the verify voltage to the selected word line is ended, the sixth signal PB_SENSE, the second signal SA_CSOC, and the fifth signal TRANSO may be changed to the 0V (GND) level. The first signal PRECHSO_N, the eighth signal SA_PRE_N, and the fourth signal SA_PRECH_N may be changed to the VCORE level.

In addition, when the memory cell connected to the first page buffer PB1 through the bit line BL is the selected memory cell, the third signal QS may be changed to 0V (GND) level, and when the memory cell connected to the first page buffer PB1 through the bit line BL is the unselected memory cell, the third signal QS may be changed to the VQS level.

Therefore, after the verify voltage is applied to the selected word line, both of the selected bit line Selected BL and the unselected bit lines Unselected BLs may be discharged. Thereafter, the selected bit line Selected BL and the unselected bit lines Unselected BLs may be precharged again in a new program loop.

Figure 10:
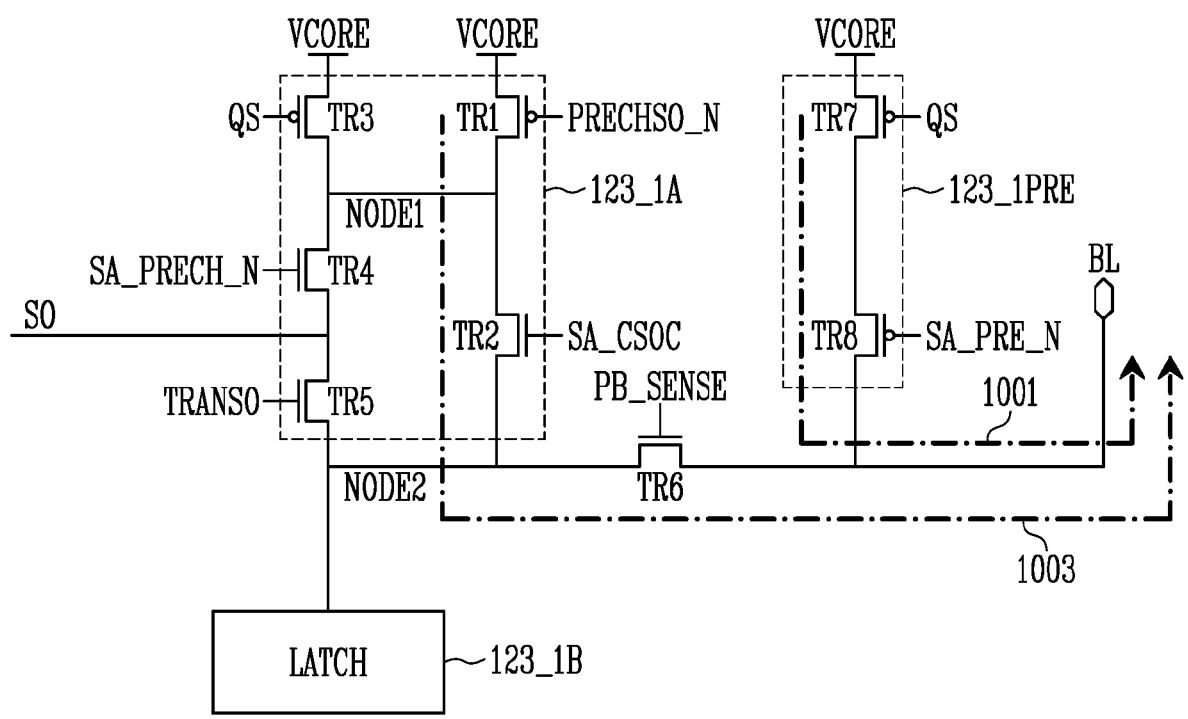
FIG. 10 is a diagram illustrating a method of precharging a bit line on which a program operation is performed and the bit line on which the program operation is inhibited.

FIG. 10 is a diagram illustrating a method of precharging the bit line on which the program operation is to be performed and the bit line on which the program operation is inhibited.

FIG. 10 illustrates a path 1003 through which the selected bit line Selected BL, to which the memory cell on which the program operation is to be performed is connected, is precharged, and a path 1001 through which the unselected bit line Unselected BLs, to which the memory cell on which the program operation is inhibited, are connected is precharged.

In an embodiment, in the bit line setup phase (t1 to t2 of FIG. 9), the unselected bit lines Unselected BLs, which are the bit lines to which the memory cells on which the program is inhibited (INHIBIT) are connected, may be precharged to the VCORE level.

Referring to FIGS. 9 and 10, in the bit line setup phase (t1 to t2 of FIG. 9), when the memory cell connected to the page buffer through the bit line BL is the unselected memory cell, as the second and sixth transistors TR2 and TR6 are turned off and the seventh and eighth transistors TR7 and TR8 are turned on, the bit line BL may be precharged to the VCORE level. That is, the VCORE voltage may be transferred to the bit line BL through the seventh and eighth transistors TR7 and TR8 (1001).

However, when the memory cell connected to the page buffer through the bit line BL is the selected memory cell, as the second, sixth, and seventh transistors TR2, TR6, and TR7 are turned off in the bit line setup phase (t1 to t2), the bit line BL may not precharged and may be at 0V (GND) level in the bit line setup phase (t1 to t2).

Thereafter, when the program pulse application phase (t2 to t3 of FIG. 9) starts, in a case where the memory cell connected to the page buffer through the bit line BL is the selected memory cell, as the first, second, and sixth transistors TR1, TR2, and TR6 are turned on and the seventh transistor TR7 is turned off, the bit line BL may be precharged by VPBSENSE–VTH, which is the difference between the voltage level VPBSENSE applied to the sixth transistor TR6 and the threshold voltage level VTH of the sixth transistor TR6 (1003).

However, when the memory cell connected to the page buffer through the bit line BL is the unselected memory cell, since the seventh and eighth transistors TR7 and TR8 are still turned on in the program pulse application phase (t2 to t3), the potential of the bit line BL may be maintained at the VCORE level in the program pulse application phase (t2 to t3).

In an embodiment, in the program phase PROGRAM PHASE, since the bit line to which the selected memory cell is connected is precharged to the VPBSENSE-VTH level, the voltage VPGM+OFFSET greater than the program voltage VPGM by the offset voltage OFFSET may be applied to the selected word line Selected WL to which the selected memory cell is connected. Herein, a voltage VPGM is a default voltage or a start voltage, corresponding to target state of the selected memory cell, for programming the selected memory cell, before gradually increasing as a step voltage. Moreover, the OFFSET may be greater than or equal to the VPBSENSE-VTH, VPBSENSE-VTH the selected bit line Selected BL precharge level, in the verify phase VERIFY PHASE.

Figure 11:
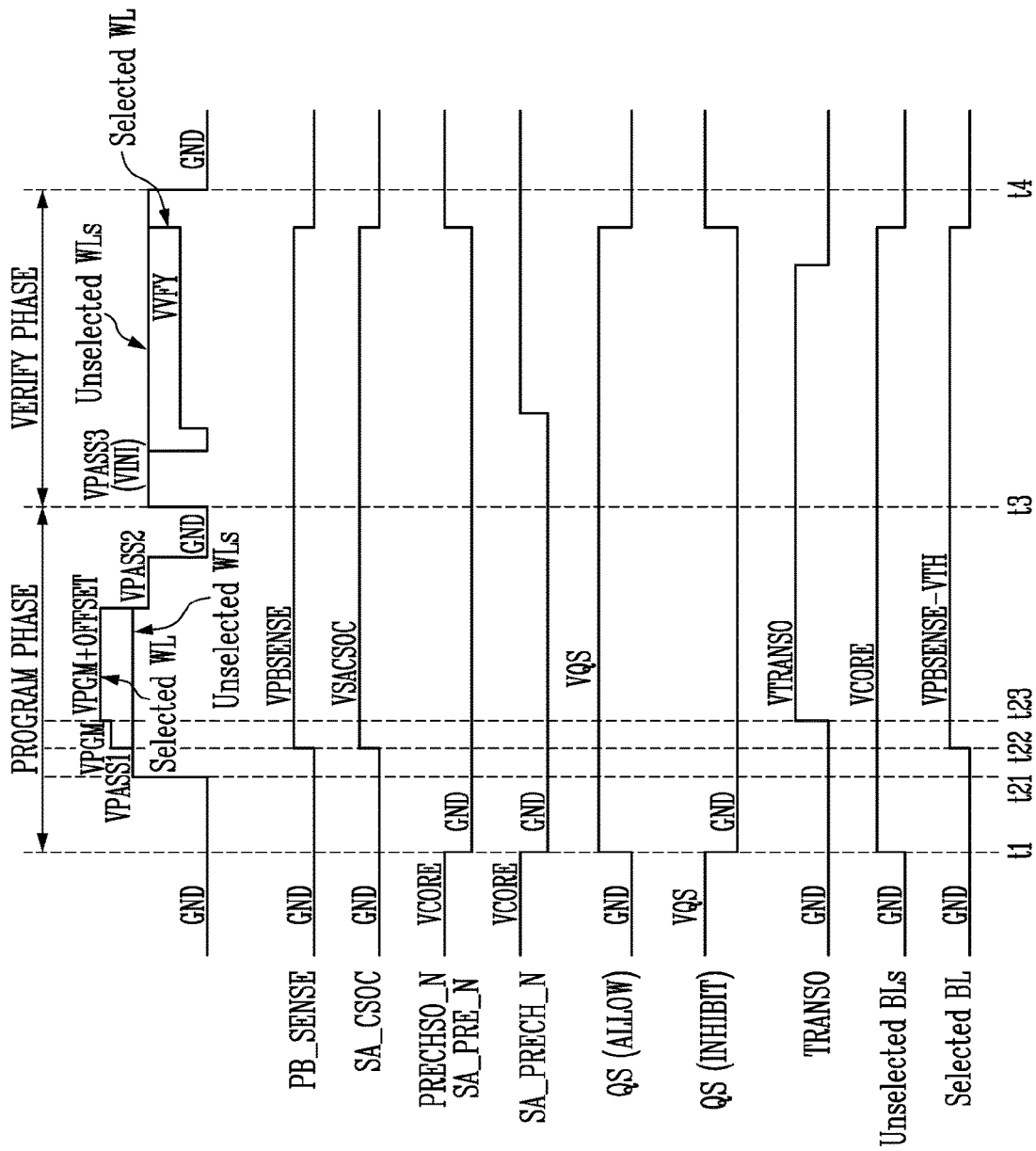
FIG. 11 is a diagram illustrating signals applied to a page buffer according to another embodiment of the present disclosure.

FIG. 11 is a diagram illustrating the signal applied to the page buffer according to another embodiment of the present disclosure.

Differently from FIG. 9, FIG. 11 illustrates a case where the voltage is increased from the VPGM level to the VPGM+ OFFSET level after the voltage is increased from the VPASS1 level to the VPGM level, rather than increasing to the VPGM+OFFSET level from the VPASS1 level immediately after the first pass voltage VPASS1 is applied to the selected word line Selected WL. FIG. 11 is the same as FIG. 9 except for the time at which the selected bit line Selected BL is precharged, and thus overlapping content is not repeated here.

In the embodiment of FIG. 9, when the first pass voltage VPASS1 is applied (t21), the sixth signal PB_SENSE is changed from 0V (GND) level to the VPBSENSE level, the second signal SA_CSOC is changed from the 0V (GND) level to the VSACSOC level, and the fifth signal TRANSO is changed from the 0V (GND) level to the VTRANSO level.

However, in the embodiment of FIG. 11, when the voltage applied to the selected word line Selected WL is increased from the VPASS1 level to the VPGM level (t22), the sixth signal PB_SENSE may be changed from the 0V (GND) level to the VPBSENSE level, the second signal SA_CSOC may be changed from the 0V (GND) level to the VSACSOC level. Moreover, when the voltage applied to the selected word line Selected WL is increased from the VPGM level to the VPGM+OFFSET level (t23), the fifth signal TRANSO may be changed from the 0V (GND) level to the VTRANSO level.

Therefore, when the voltage applied to the selected word line Selected WL increases from the VPASS1 level to the VPGM level (t22), in a case where the memory cell connected to the first page buffer PB1 through the bit line BL is the unselected memory cell, that is, the unselected bit lines Unselected BLs, to which the memory cells on which the program is inhibited (INHIBIT) are connected, may be maintained at the VCORE level.

However, when the memory cell connected to the first page buffer PB1 through the bit line BL is the selected memory cell, that is, the selected bit line Selected BL, which is the selected bit line Selected BL to which the memory cell on which the program is allowed (ALLOW) is connected may be precharged to VPBSENSE-VTH level when the voltage applied to the selected word line Selected WL is increased from the VPASS1 level to the VPGM level (t22).

As a result, when the voltage applied to the selected word line Selected WL increases from 0V to the VPASS1 level and from the VPASS1 level to the VPGM level, that is, when the voltage applied to the selected word line Selected WL increases step by step, when the voltage increases from the VPGM level to the VPGM+OFFSET level, the selected bit line Selected BL may be precharged.

Figure 12:
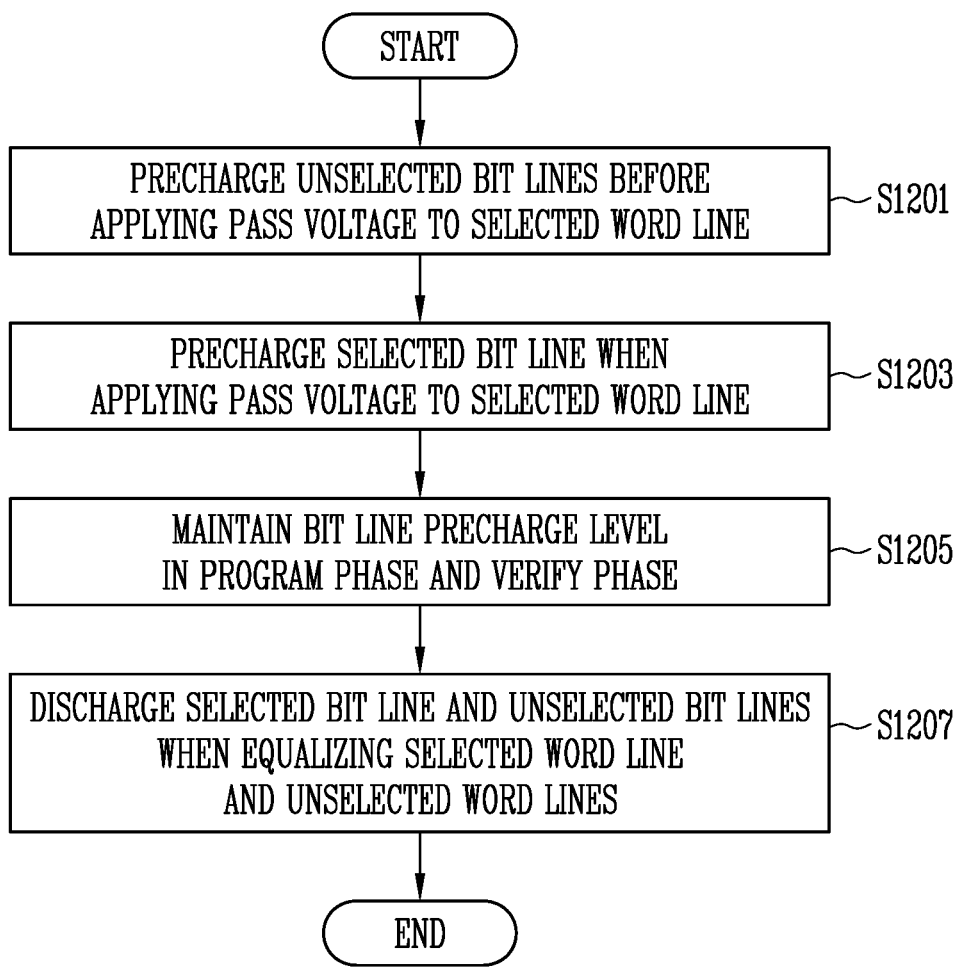
FIG. 12 is a diagram illustrating an operation of a memory device according to an embodiment of the present disclosure.

FIG. 12 is a diagram illustrating an operation of the memory device according to an embodiment of the present disclosure.

Referring to FIG. 12, in operation S1201, the memory device may precharge the unselected bit lines before applying the pass voltage to the selected word line. The unselected bit lines may refer to the bit lines to which the memory cells on which the program is inhibited are connected.

In an embodiment, voltage levels applied to the gates of the transistors included in the page buffer may be set to precharge the unselected bit lines.

In operation S1203, when applying the pass voltage to the selected word line, the selected bit line may be precharged. The selected bit line may be connected to the memory cell on which the program operation is to be performed, and the selected bit line may be precharged to a voltage level corresponding to the difference between the level of the signal applied to the gate of the transistor connecting the bit line and the latch and the magnitude of the threshold voltage of the corresponding transistor.

Thereafter, in operation S1205, the selected bit line and the unselected bit lines may be maintained at their respective precharge levels in the program phase and the verify phase. That is, the bit lines may be precharged only once without discharging during both the program phase and the verify phase.

In operation S1207, after the verify voltage is applied to the selected word line, the memory device may discharge the selected bit line and the unselected bit lines when equalizing the selected word line and the unselected word lines. That is, since one program loop ends as the verify phase ends, the selected bit line and the unselected bit lines may be discharged. Thereafter, when a new program loop is performed, the selected bit line and the unselected bit lines may be precharged again.

Figure 13:
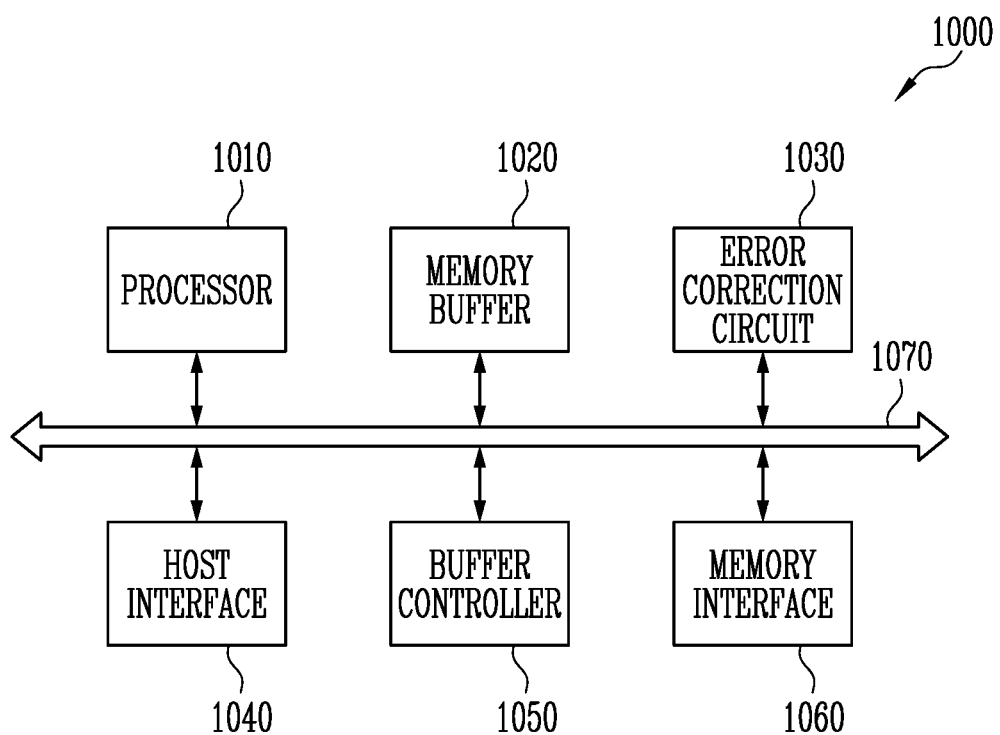
FIG. 13 is a diagram illustrating another embodiment of a memory controller, such as that of FIG. 1.

FIG. 13 is a diagram illustrating another embodiment of the memory controller of FIG. 1.

The memory controller 1000 is connected to a host and the memory device. The memory controller 1000 is configured to access the memory device in response to a request from the host, e.g., host 300 of FIG. 1. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 13, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. Any suitable address mapping method may be applied by the flash translation layer. Which mapping method is used depends on the mapping unit used by the system. To that end, various address mapping methods are available including a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in, as a component of, the memory interface 1060.

The host interface 1040 is configured to communicate with an external host under control of the processor 1010. The host interface 1040 may be configured to perform communication using at least one of various communication protocols such as a universal serial bus (USB), a serial AT attachment (SATA), a serial attached SCSI (SAS), a high speed interchip (HSIC), a small computer system interface (SCSI), a peripheral component interconnection express (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and/or a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In another embodiment, the memory controller 1000 may not include the memory buffer 1020 and the buffer controller 1050. Each of these components may be provided separately and operably coupled to the memory controller 1000.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other so as not to interfere with, nor affect, each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1202, and the memory interface 1060.

Figure 14:
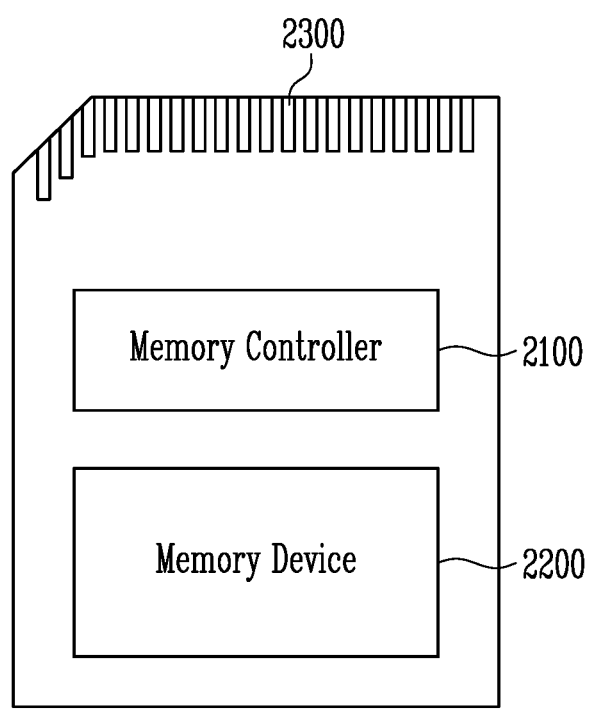
FIG. 14 is a block diagram illustrating a memory card system to which a storage device is applied according to an embodiment of the present disclosure.

FIG. 14 is a block diagram illustrating a memory card system to which the storage device is applied according to an embodiment of the present disclosure.

Referring to FIG. 14, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be configured the same as the memory device 100 of FIG. 1 as described with reference to FIG. 2.

As an example, the memory controller 2100 may include components such as a random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe. As an example, the connector 2300 may be defined by at least one of the various communication standards described above.

As an example, the memory device 2200 may be implemented as any of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin transfer torque magnetic RAM (STT-MRAM).

The memory controller 2100 and the memory device 2200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMC-micro, or eMMC), an SD card (SD, miniSD, microSD, or SDHC), and/or a universal flash storage (UFS).

In an embodiment, when the memory device 2200 performs the program operation, the memory device 2200 may precharge once the bit lines BL1 to BLn connecting the page buffers PB1 to PBn and the memory cell array 110, of FIG. 2. That is, even though the bit lines BL1 to BLn are precharged only once, the program operation may be performed.

For example, during the program operation, the bit lines BL1 to BLn may be precharged and then discharged in the program phase, and the bit lines BL1 to BLn may be precharged again in the verify phase. However, in the program phase, the memory device 2200 may precharge the bit lines BL1 to BLn and then maintain the precharge level without discharging.

In an embodiment, the memory device 2200 may include the precharge circuit for precharging the bit lines BL1 to BLn only once. The precharge circuit may be configured of a plurality of transistors, and the plurality of transistors may be turned on or turned off to precharge the bit lines.

In an embodiment, before the program voltage is applied to the selected word line Selected WL to which the selected memory cell, on which the program operation is to be performed, is connected and the pass voltage is applied to the unselected word lines Unselected WLs, the bit lines BL1 to BLn may be precharged. The bit lines BL1 to BLn may be precharged to different levels according to whether or not a particular bit line includes the memory cell on which the program operation is to be performed.

For example, when the memory cell on which the program operation is to be performed is connected to the bit line, voltages for precharging the corresponding bit line may be applied to the page buffer to which the bit line is connected. The precharge circuit may not be connected to the bit line and may be separated from the bit line.

As another example, when the memory cell on which the program operation is to be performed is not present among the memory cells connected to the bit line, the voltages for precharging the corresponding bit line may be applied to the page buffer to which the bit line is connected. The precharge circuit may be connected to the bit line.

The voltage applied to the selected word line Selected WL may be a voltage greater than the program voltage by the offset voltage. When the bit lines BL1 to BLn are precharged in the program phase, since the potential of the bit line connected to the selected memory cell is set to a specific level other than 0V, the program voltage may be set to be greater by the offset voltage.

In an embodiment, before the program voltage is applied to the selected word line Selected WL, the bit lines BL1 to BLn may be precharged, and the potential of the bit lines BL1 to BLn may continuously maintain an initial precharge level. Thereafter, when the operation of applying the verify voltage to the selected word line Selected WL is completed, the bit lines BL1 to BLn may be discharged.

As a result, during the program operation, since the bit lines BL1 to BLn are not repeatedly precharged or discharged and instead are precharged or discharged only once, a time consumed in the program operation may be reduced.

Figure 15:
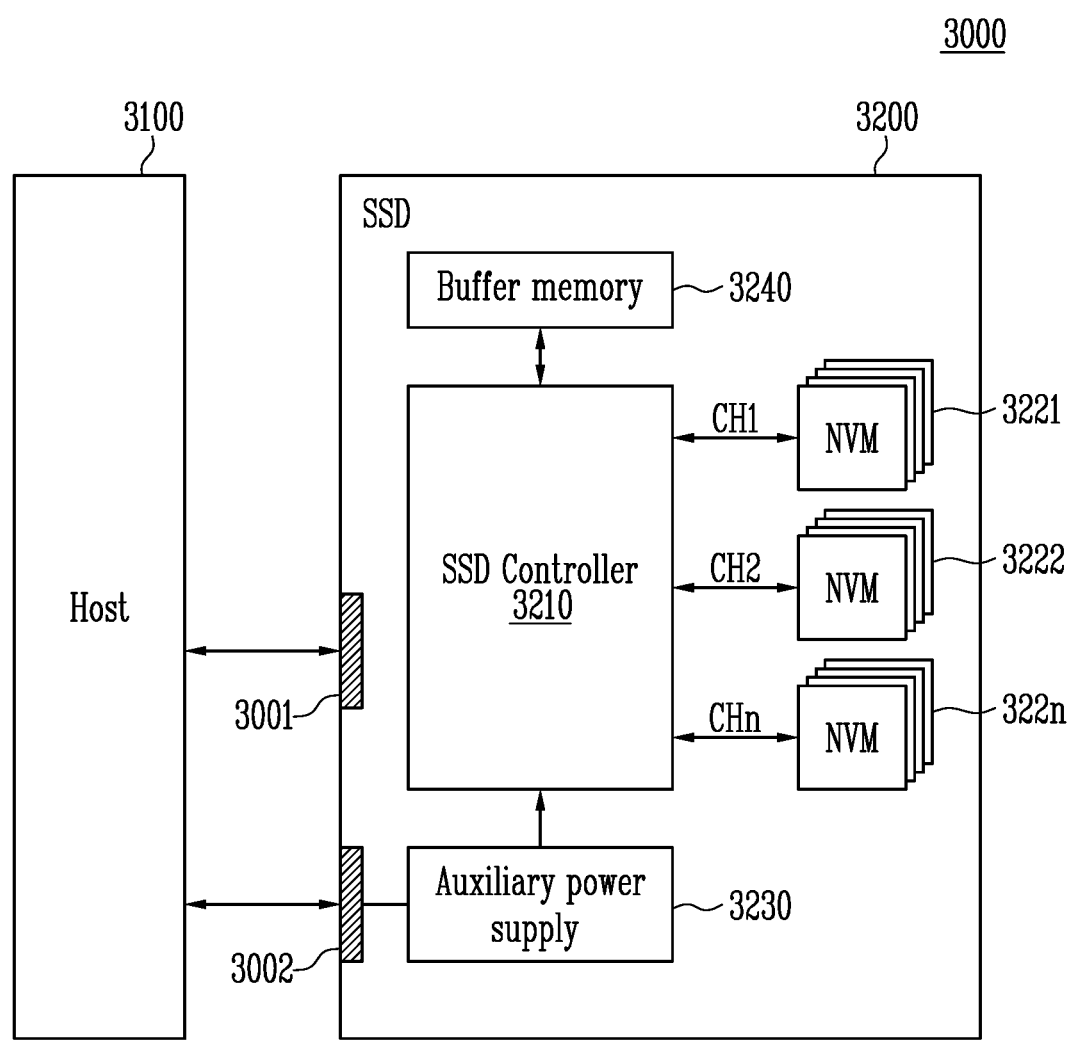
FIG. 15 is a block diagram illustrating a solid state drive (SSD) system to which a storage device is applied according to an embodiment of the present disclosure.

FIG. 15 is a block diagram illustrating a solid state drive (SSD) system to which the storage device is applied according to an embodiment of the present disclosure.

Referring to FIG. 15, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1.

The SSD controller 3210 may control the plurality of flash memories 3221 to 322n in response to the signal SIG, which may be more than one signal, received from the host 3100. As an example, the signal(s) SIG may be based on an interface between the host 3100 and the SSD 3200. For example, the signal(s) SIG may be defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe.

In an embodiment, when the flash memories 3221 to 322n perform the program operation, the flash memories 3221 to 322n may precharge once bit lines connecting page buffers included in each of the flash memories 3221 to 322n and the memory cell array. That is, even though the bit lines are precharged only once, the program operation may be performed.

For example, during the program operation, the bit lines may be precharged and then discharged in the program phase, and the bit lines may be precharged again in the verify phase. However, in the program phase, the flash memories 3221 to 322n may precharge the bit lines and then maintain the precharge level without discharging.

In an embodiment, the flash memories 3221 to 322n may include the precharge circuit for precharging the bit lines only once. The precharge circuit may be configured of a plurality of transistors, and the plurality of transistors may be turned on or turned off to precharge the bit lines.

In an embodiment, before the program voltage is applied to the selected word line Selected WL to which the selected memory cell, on which the program operation is to be performed, is connected and the pass voltage is applied to the unselected word lines Unselected WLs, the bit lines may be precharged. The bit lines may be precharged to different levels according to whether a particular bit line includes the memory cell on which the program operation is to be performed.

For example, when the memory cell on which the program operation is to be performed is present among the memory cells connected to the bit line, the voltages for precharging the corresponding bit line may be applied to the page buffer to which the bit line is connected. The precharge circuit may not be connected to the bit line and may be separated from the bit line.

As another example, when the memory cell on which the program operation is to be performed is not present among the memory cells connected to the bit line, the voltages for precharging the corresponding bit line may be applied to the page buffer to which the bit line is connected. The precharge circuit may be connected to the bit line.

The voltage applied to the selected word line Selected WL may be a voltage greater than the program voltage by the offset voltage. When the bit lines are precharged in the program phase, since a potential of the bit line connected to the selected memory cell is set to a specific level other than 0V, the program voltage may be set to be greater by the offset voltage.

In an embodiment, before the program voltage is applied to the selected word line Selected WL, the bit lines may be precharged, and the potential of the bit lines may continuously maintain the initial precharge level. Thereafter, when the operation of applying the verify voltage to the selected word line Selected WL is completed, the bit lines may be discharged.

As a result, during the program operation, since the bit lines are not repeatedly precharged or discharged and are instead precharged or discharged only once, a time consumed in the program operation may be reduced.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be disposed in or external to the SSD 3200. For example, the auxiliary power device 3230 may be disposed on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 16:
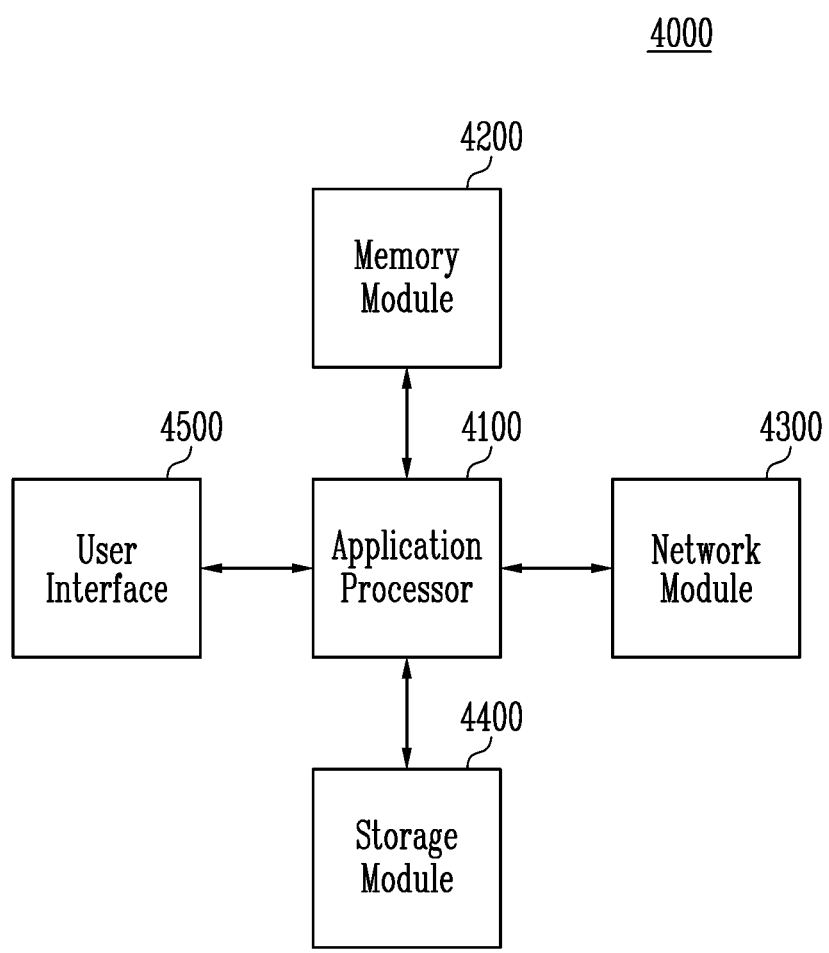
FIG. 16 is a block diagram illustrating a user system to which a storage device is applied according to an embodiment of the present disclosure.

FIG. 16 is a block diagram illustrating a user system to which the storage device according is applied to an embodiment of the present disclosure.

Referring to FIG. 16, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, each of which may operate identically to the memory device described with reference to FIGS. 2 and 3. The storage module 4400 may operate identically to the storage device 50 described with reference to FIG. 1.

In an embodiment, when the storage module 4400 performs the program operation, the storage module 4400 may precharge once bit lines connecting page buffers included in the storage module 4400 and the memory cell array. That is, even though the bit lines are precharged only once, the program operation may be performed.

For example, during the program operation, the bit lines may be precharged and then discharged in the program phase, and the bit lines may be precharged again in the verify phase. However, in the program phase, the storage module 4400 may precharge the bit lines and then maintain the precharge level without discharging, without division of the program phase and the verify phase.

In an embodiment, the storage module 4400 may include the precharge circuit for precharging the bit lines only once without division of the program phase and the verify phase. The precharge circuit may be configured of a plurality of transistors, and the plurality of transistors may be turned on or turned off to precharge the bit lines.

In an embodiment, before the program voltage is applied to the selected word line Selected WL to which the selected memory cell on which the program operation is to be performed is connected and the pass voltage is applied to the unselected word lines Unselected WLs except for the selected word line Selected WL, the bit lines may be precharged. The bit lines may be precharged to different levels according to whether the memory cell on which the program operation is to be performed is present among the memory cells connected to the bit lines.

For example, when the memory cell on which the program operation is to be performed is present among the memory cells connected to the bit line, the voltages for precharging the corresponding bit line may be applied to the page buffer to which the bit line is connected. The precharge circuit may not be connected to the bit line and may be separated from the bit line.

As another example, when the memory cell on which the program operation is to be performed is not present among the memory cells connected to the bit line, the voltages for precharging the corresponding bit line may be applied to the page buffer to which the bit line is connected. The precharge circuit may be connected to the bit line.

The voltage applied to the selected word line Selected WL may be a voltage greater than the program voltage by the offset voltage. When the bit lines are precharged in the program phase, since the potential of the bit line connected to the selected memory cell is set to a specific level other than 0V, the program voltage may be greater by the offset voltage.

In an embodiment, before the program voltage is applied to the selected word line Selected WL, the bit lines may be precharged, and the potential of the bit lines may continuously maintain the initial precharge level. Thereafter, when the operation of applying the verify voltage to the selected word line Selected WL is completed, the bit lines may be discharged.

As a result, during the program operation, since the bit lines are not repeatedly precharged or discharged and are instead precharged or discharged only once, a time consumed in the program operation may be reduced.

The user interface 4500 may include interfaces for inputting data or an instruction to the application processor 4100 or for outputting data to an external device. For example, the user interface 4500 may include any of various user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

While the present invention has been illustrated and described in connection with various embodiments, those skilled in the art will recognize in view of the present disclosure that various modifications may be made. The present invention encompasses all such modifications that fall within the scope of the claims.

What is claimed is:

1. A memory device comprising:
a plurality of memory cells connected to a word line and respectively connected to a plurality of bit lines;
a plurality of page buffers respectively connected to the plurality of bit lines; and
a voltage generator configured to generate voltages to apply to each of the plurality of page buffers,
wherein the each of the plurality of page buffers is configured to apply a precharge voltage having a level higher than a preset level to a corresponding bit line among the plurality of bit lines during a time, from a program operation time of applying a program voltage to the word line, to a verify operation time of applying a verify voltage to the word line.

2. The memory device of claim 1, wherein the each of the plurality of page buffers includes a precharge circuit, and
wherein the precharge circuit includes:
a first transistor that is selectively connected to a power voltage; and
a second transistor that selectively connects the first transistor to any one of the plurality of bit lines.

3. The memory device of claim 2, wherein the voltage generator is configured to, when a memory cell connected to the precharge circuit through a bit line among the plurality of bit lines is a selected memory cell to be programmed, apply a voltage for turning off the first transistor to the first transistor during a program operation of applying the program voltage to the word line.

4. The memory device of claim 3, wherein the voltage generator is configured to apply the voltage for turning off the first transistor to the first transistor until a verify operation of applying the verify voltage to the word line is completed.

5. The memory device of claim 3, wherein the voltage generator is configured to apply the program voltage, that is higher than a default program voltage corresponding to a target program state by an offset voltage, to the word line.

6. The memory device of claim 2, wherein the voltage generator is configured to, when a memory cell connected to the precharge circuit through a bit line among the plurality of bit lines is an unselected memory cell to be program inhibited, apply a voltage for turning on the first transistor and the second transistor to the first transistor and the second transistor during a program operation of applying the program voltage to the word line.

7. The memory device of claim 6, wherein the voltage generator is configured to apply the voltage for turning on the first transistor and the second transistor to the first transistor and the second transistor until a verify operation of applying the verify voltage to the word line is completed.

8. The memory device of claim 1, wherein the each of the plurality of page buffers comprises:
a latch configured to store data;
a data transmitter configured to transmit the data stored in the latch; and
a sixth transistor configured to connect the latch, the data transmitter, and any one of the plurality of bit lines.

9. The memory device of claim 8, wherein, when a memory cell connected to a bit line among the plurality of bit lines is a selected memory cell to be programmed, a level of the precharge voltage applied to the bit line is based on a difference between a gate voltage of the sixth transistor and a threshold voltage of the sixth transistor.

10. The memory device of claim 8, wherein the data transmitter comprises:
a first transistor connected between a power voltage and a first node;
a second transistor connected to the first transistor through the first node and connected to the sixth transistor through a second node;
a third transistor connected between the power voltage and the first node;
a fourth transistor connected between the first node and a sensing node; and
a fifth transistor connecting the fourth transistor and the latch.

11. The memory device of claim 10, wherein, when a memory cell connected to the data transmitter through a bit line among the plurality of bit lines is a selected memory cell to be programmed, the bit line is precharged through the first transistor, the second transistor, and the sixth transistor during program operation of applying the program voltage to the word line.

12. The memory device of claim 10, wherein, when a memory cell connected to the data transmitter through a bit line among the plurality of bit lines is an unselected memory cell to be program inhibited, the bit line is precharged to a level of the power voltage through a precharge circuit.

13. The memory device of claim 10, wherein, when a pass voltage is applied to the word line before the program voltage is applied to the word line, the voltage generator is configured to apply a voltage for turning on the sixth transistor to the sixth transistor.

14. The memory device of claim 13, wherein the voltage generator is configured to apply the voltage for turning on the sixth transistor to the sixth transistor until a verify operation of applying the verify voltage to the word line is completed.

15. The memory device of claim 10, wherein when a pass voltage is applied to the word line before the program voltage is applied to the word line, the voltage generator is configured to apply voltage for turning on the second transistor to the second transistor.

16. The memory device of claim 15, wherein the voltage generator is configured to apply the voltage for turning on the second transistor to the second transistor until a verify operation of applying the verify voltage to the word line is completed.

17. A method of operating a memory device comprising a plurality of memory cells connected to a plurality of bit lines, the method comprising:
increasing a potential of each of the plurality of bit lines;
performing a program operation on a selected memory cell among the plurality of memory cells while the increased potential of the each of the plurality of bit lines is maintained; and
performing a verification operation on the selected memory cell while the increased potential of the each of the plurality of bit lines is maintained after the program operation.

18. The method of claim 17, wherein the increasing the potential includes increasing potentials of bit lines connected to unselected memory cells to be program inhibited among the plurality of bit lines.

19. The method of claim 18, wherein the increasing the potential includes increasing a potential of a bit line connected to the selected memory cell among the plurality of bit lines after the potentials of the bit lines connected to the unselected memory cells are increased.

20. An integrated circuit coupled to a nonvolatile memory cell array through a first bit line, the integrated circuit comprising:
a first path through which a power voltage is transferred to a node during a first program operation of programming a memory cell coupled to the first bit line;
a second path through which the power voltage is transferred to the first bit line during a second program operation of programming a memory cell coupled to a second bit line to precharge the first bit line to the power voltage without performing discharge during the second program operation; and
a transistor configured to couple the node to the first bit line in response to a turn-on signal having a turn-on level during the first program operation to precharge the first bit line to the turn-on level less a threshold voltage level of the transistor without performing discharge during the first program operation,
wherein each of the first and second program operations comprises a program phase and a verify phase.

* * * * *